US012584972B2

(12) United States Patent
Kim et al.

(10) Patent No.: US 12,584,972 B2
(45) Date of Patent: ***Mar. 24, 2026

(54) BATTERY DIAGNOSIS APPARATUS AND BATTERY DIAGNOSIS METHOD

(71) Applicant: LG ENERGY SOLUTION, LTD., Seoul (KR)

(72) Inventors: Tae-Hyeon Kim, Daejeon (KR); Young-Deok Kim, Daejeon (KR); Hyun-Jun Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/661,522

(22) Filed: May 10, 2024

(65) Prior Publication Data

US 2025/0199084 A1 Jun. 19, 2025

(30) Foreign Application Priority Data

Dec. 14, 2023 (KR) ........................ 10-2023-0182423

(51) Int. Cl.
*G01R 31/392* (2019.01)
*G01R 31/3842* (2019.01)
(Continued)

(52) U.S. Cl.
CPC ....... *G01R 31/392* (2019.01); *G01R 31/3842* (2019.01); *G01R 31/396* (2019.01);
(Continued)

(58) Field of Classification Search
CPC .............. G01R 31/392; G01R 31/396; G01R 31/3842; H01M 10/48; H01M 2010/4271
(Continued)

(56) References Cited

U.S. PATENT DOCUMENTS

| | | | |
|---|---|---|---|
| 2019/0361076 A1 | 11/2019 | Koyamada et al. | |
| 2023/0160970 A1 | 5/2023 | Choi et al. | |

(Continued)

FOREIGN PATENT DOCUMENTS

| | | |
|---|---|---|
| JP | 2019-160662 A | 9/2019 |
| JP | 2019-203777 A | 11/2019 |

(Continued)

OTHER PUBLICATIONS

International Search Report, KR2024/018682, Feb. 25, 2025. (Year: 2025).*
Written Opinion, KR2024/018682, Feb. 25, 2025. (Year: 2025).*

*Primary Examiner* — Michael P Nghiem
(74) *Attorney, Agent, or Firm* — Bryan Cave Leighton Paisner LLP

(57) ABSTRACT

Disclosed is a battery diagnosing apparatus and a battery diagnosing method. The battery diagnosing apparatus includes a data obtaining unit configured to obtain a first profile representing a capacity-voltage relationship of a battery cell containing at least two kinds of active materials, and a processor configured to generate a plurality of comparison profiles based on a plurality of electrode profiles included in an electrode profile map. The processor is configured to select, as a second profile, one comparison profile from the plurality of comparison profiles by comparing each of the plurality of comparison profiles with the first profile. The processor is configured to determine at least one diagnostic factor representing a degradation state of the battery cell based on the second profile.

19 Claims, 19 Drawing Sheets

(51) Int. Cl.
  *G01R 31/396*      (2019.01)
  *H01M 10/42*      (2006.01)
  *H01M 10/48*      (2006.01)

(52) U.S. Cl.
  CPC ......... *H01M 10/425* (2013.01); *H01M 10/48*
          (2013.01); *H01M 2010/4271* (2013.01)

(58) Field of Classification Search
  USPC .......................................................... 702/63
  See application file for complete search history.

(56)          References Cited

U.S. PATENT DOCUMENTS

| | | | | |
|---|---|---|---|---|
| 2023/0160971 A1* | 5/2023 | Cha | ....................... | H01M 10/42 |
| | | | | 324/432 |
| 2023/0182575 A1 | 6/2023 | Kim et al. | | |

| | | | | |
|---|---|---|---|---|
| 2023/0236262 A1 | 7/2023 | Choi et al. | | |
| 2023/0280403 A1 | 9/2023 | Jeong et al. | | |
| 2023/0387461 A1* | 11/2023 | Sun | ................... | H01M 10/0567 |
| 2024/0012058 A1* | 1/2024 | Lim | ...................... | H01M 10/42 |
| 2025/0201946 A1* | 6/2025 | Choi | ................. | H01M 10/4285 |

FOREIGN PATENT DOCUMENTS

| | | | |
|---|---|---|---|
| JP | 7120938 | B2 | 8/2022 |
| JP | 2023-093059 | A | 7/2023 |
| KR | 10-2013-0126273 | A | 11/2013 |
| KR | 1020190106126 | A | 9/2019 |
| KR | 1020200018308 | A | 2/2020 |
| KR | 10-2021-0149626 | A | 12/2021 |
| KR | 1020220021730 | A | 2/2022 |
| KR | 10-2022-0033350 | A | 3/2022 |
| KR | 10-2022-0093840 | A | 7/2022 |
| KR | 10-2022-0094042 | A | 7/2022 |
| WO | WO2025075340 | * | 4/2025 |

* cited by examiner

POSITIVE ELECTRODE PROFILE
(WITH SINGLE ACTIVE MATERIAL)

POSITIVE ELECTRODE PROFILE
(WITH SINGLE ACTIVE MATERIAL)

POSITIVE ELECTRODE PROFILE
(WITH AT LEAST TWO KINDS OF ACTIVE MATERIALS)

POSITIVE ELECTRODE PROFILE
(WITH AT LEAST TWO KINDS OF ACTIVE MATERIALS)

BATTERY DIAGNOSIS APPARATUS AND BATTERY DIAGNOSIS METHOD

TECHNICAL FIELD

The present disclosure relates to technology for non-destructively diagnosing a state of a battery.

The present application claims priority to Korean Patent Application No. 10-2023-0182423 filed on Dec. 14, 2023 in the Republic of Korea, the disclosures of which are incorporated herein by reference.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Although much research is being done on these batteries in terms of increasing capacity and density, improvements in lifespan and safety are also important. In order to improve battery safety, the current state of the battery must be accurately diagnosed.

Accurately diagnosing the internal state of a battery cell is essential for safety and long lifespan. To diagnose the internal state of a battery cell without disassembly, relationship data (which can be referred to as a full-cell profile or the like) showing the correspondence between the full-cell capacity and the full-cell voltage is mainly used.

Conventionally, the degradation state of each electrode of a battery cell was diagnosed by analyzing the relationship data of the battery cell. This conventional diagnostic method may be regarded as being effective only when the overall profile of each electrode of the battery cell remains almost the same as when the battery cell was released, even if the battery cell deteriorates from the time of release.

However, in the case of some types of battery cells in which at least one of the positive electrode and the negative electrode contains at least two kinds of active materials, the deviation in degradation characteristics between the active materials becomes more severe as the battery cell deteriorates more, and as a result, the overall design of the electrode may become significantly distorted from the time of release. Therefore, if a conventional diagnosis method is applied to a battery cell in which at least one of the positive electrode and the negative electrode contains at least two kinds of active materials, the accuracy of diagnosis on the degradation state of each electrode may be greatly reduced.

DISCLOSURE

Technical Problem

The present disclosure is designed to solve the problems of the related art, and therefore the present disclosure is directed to providing a battery diagnosing apparatus and a battery diagnosing method, which may determine at least one diagnostic factor representing a degradation state of a battery cell containing at least two kinds of active materials in at least one of a positive electrode and a negative electrode.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery diagnosing apparatus, comprising: a data obtaining unit configured to obtain a first profile representing a capacity-voltage relationship of a battery cell, the battery cell comprising at least two kinds of active materials; and a processor configured to generate a plurality of comparison profiles based on a plurality of electrode profiles included in an electrode profile map.

The processor selects, as a second profile, one comparison profile from the plurality of comparison profiles by comparing each of the plurality of comparison profiles with the first profile. The processor is configured to determine at least one diagnostic factor representing a degradation state of the battery cell based on the second profile.

The electrode profile map may include a plurality of reference positive electrode profiles associated with a plurality of degradation states of a positive electrode of the battery cell. The at least two kinds of active materials may be included in the positive electrode of the battery cell.

Each of at least two reference positive electrode profiles of the plurality of reference positive electrode profiles may be a degradation positive electrode profile representing a capacity-voltage relationship of a positive electrode half-cell.

The processor may be configured to determine a comparison value based on the at least two reference positive electrode profiles. The comparison value may be greater than a threshold value.

The electrode profile map may include a plurality of reference negative electrode profiles associated with a plurality of degradation states of a negative electrode of the battery cell. The at least two kinds of active materials may be included in the negative electrode of the battery cell.

Each of at least two reference negative electrode profiles of the plurality of reference negative electrode profiles may be a degradation negative electrode profile representing a capacity-voltage relationship of a negative electrode half-cell.

The processor may be configured to determine a comparison value based on the at least two reference negative electrode profiles. The comparison value may be greater than a threshold value.

The processor may be configured to generate the plurality of comparison profiles by performing an adjustment procedure for each of the plurality of electrode profiles according to a plurality of adjustment levels.

The adjustment procedure may comprise at least one of a scaling operation or a shifting operation based on capacity relationship values of the battery cell.

The processor may be configured to determine a plurality of comparison values by comparing each of the plurality of comparison profiles with the first profile. The second profile may be associated with a minimum comparison value among the plurality of comparison values.

The processor may be configured to generate profile adjustment data associated with the second profile. The profile adjustment data may include at least one of positive electrode state data associated with an adjusted positive electrode profile and negative electrode state data associated with an adjusted negative electrode profile. The adjusted positive electrode profile and the adjusted negative electrode profile may be generated by adjusting two electrode profiles of the plurality of electrode profiles. The adjusted positive electrode profile and the adjusted negative electrode profile may be used to generate the second profile.

The processor may be configured to generate the second profile based on voltage difference data representing voltage difference between the adjusted positive electrode profile and the adjusted negative electrode profile.

The positive electrode state data may include at least one of a first positive electrode point, a second positive electrode point, a positive electrode scale factor, and a positive electrode loading amount as the at least one diagnostic factor.

The negative electrode state data may include at least one of a first negative electrode point, a second negative electrode point, a negative electrode scale factor, and a negative electrode loading amount as the at least one diagnostic factor.

The processor may be configured to limit at least one of a voltage range and a State of Charge (SOC) range for the battery cell, based on the at least one diagnostic factor.

In another aspect of the present disclosure, there is also provided a battery pack, comprising the battery diagnosing apparatus.

In still another aspect of the present disclosure, there is also provided a battery system, comprising the battery pack.

In still another aspect of the present disclosure, there is also provided a remote diagnosing server, comprising the battery diagnosing apparatus.

In still another aspect of the present disclosure, there is also provided a battery diagnosing method, comprising: obtaining a first profile representing a capacity-voltage relationship of a battery cell, the battery cell comprising at least two kinds of active materials; generating a plurality of comparison profile based on a plurality of electrode profiles included in an electrode profile map, selecting, as a second profile, one comparison profile from the plurality of comparison profiles by comparing each of the plurality of comparison profiles with the first profile; and determining at least one diagnostic factor representing a degradation state of the battery cell based on the second profile.

In still another aspect of the present disclosure, there is also provided a computer-readable medium storing instructions for diagnosing a battery cell. When executed by one or more processors, the instructions cause the one or more processors to perform operations comprising: obtaining a first profile representing a capacity-voltage relationship of the battery cell, the battery cell comprising at least two kinds of active materials; generating a plurality of comparison profile based on a plurality of electrode profiles included in an electrode profile map; selecting, as a second profile, one comparison profile from the plurality of comparison profiles by comparing each of the plurality of comparison profiles with the first profile; and determining at least one diagnostic factor representing a degradation state of the battery cell based on the second profile.

Advantageous Effects

According to at least one of the embodiments of the present disclosure, at least one diagnostic factor representing a degradation state of a battery cell containing at least two kinds of active materials in at least one of a positive electrode and a negative electrode may be precisely determined.

In addition, according to at least one of the embodiments of the present disclosure, based on at least one diagnostic factor, at least one degradation parameter indicating the degradation state of the positive electrode, the negative electrode and/or the available lithium of the battery cell may be determined.

In addition, according to at least one of the embodiments of the present disclosure, the safety and long lifespan of the battery cell may be achieved by adjusting (limiting) the usage conditions (e.g., voltage range, SOC range, current, etc.) allowable for the battery cell based on the diagnosis results for the battery cell.

The effects of the present disclosure are not limited to the effects mentioned above, and these and other effects will be clearly understood by those skilled in the art from the appended claims.

DESCRIPTION OF DRAWINGS

The accompanying drawings illustrate exemplary embodiments of the present disclosure and together with the following detailed description, serve to provide a further understanding of the technical aspect of the present disclosure, and thus the present disclosure should not be construed as being limited to the drawings.

BEST MODE

Figure 1:
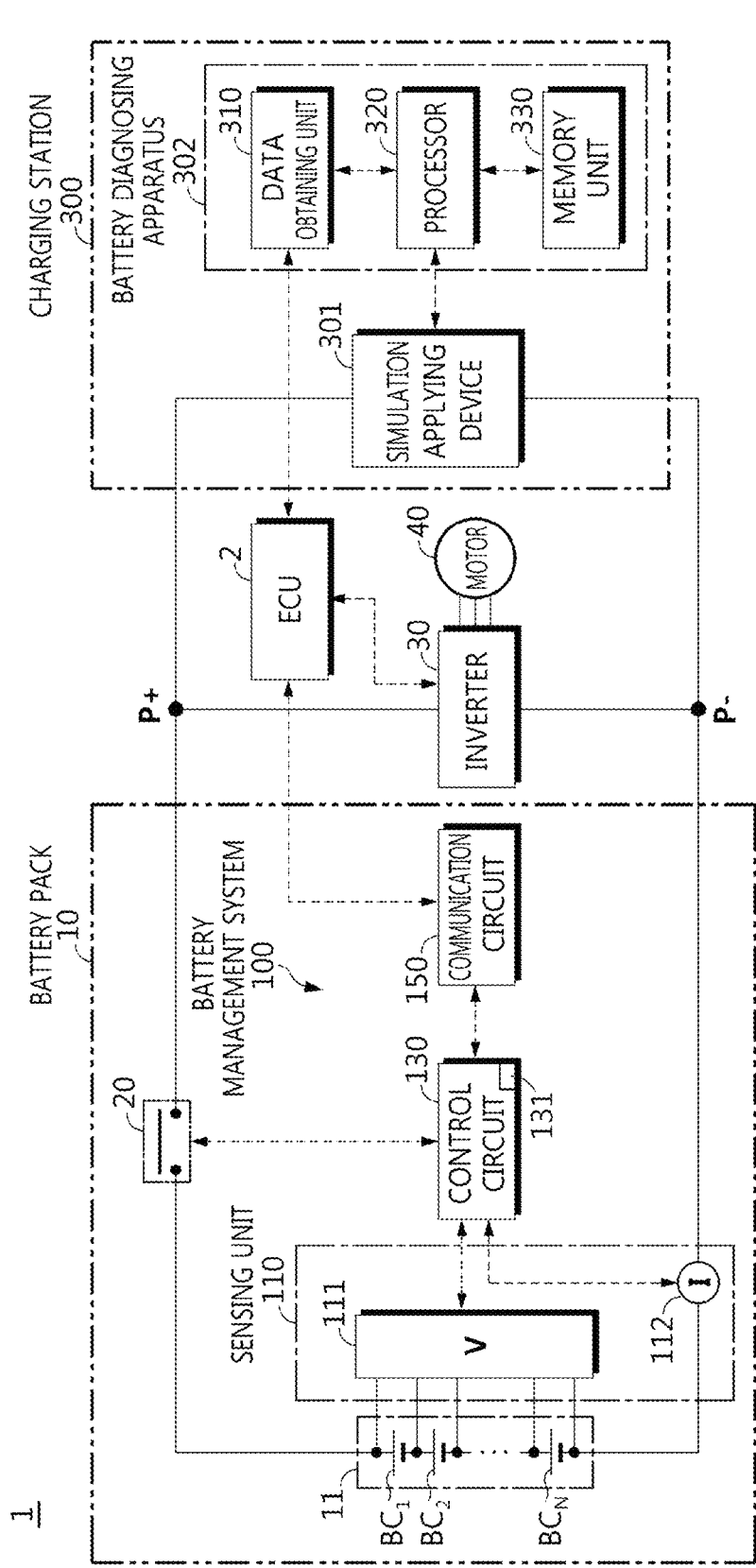
FIG. 1 is a diagram exemplarily showing a battery diagnosing apparatus, a battery system, and a charging station according to an embodiment of the present disclosure.

The subject matter of the present description will now be described more fully hereinafter with reference to the accompanying drawings, which form a part thereof, and which show, by way of illustration, specific exemplary embodiments. An embodiment or implementation described herein as "exemplary" is not to be construed as preferred or advantageous, for example, over other embodiments or implementations; rather, it is intended to reflect or indicate that the embodiment(s) is/are "example" embodiment(s). Subject matter can be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. Both the foregoing general description and the following detailed description are exemplary and explanatory only and are not restrictive of the features, as claimed.

In this disclosure, the term "based on" means "based at least in part on." The terms including the ordinal number such as "first", "second" and the like, may be used to distinguish one element from another among various elements, but not intended to limit the elements by the terms. The singular forms "a," "an," and "the" include plural referents unless the context dictates otherwise. The term "exemplary" is used in the sense of "example" rather than "ideal." The term "or" is meant to be inclusive and means either, any, several, or all of the listed items. The terms "comprises," "comprising," "includes," "including," or other variations thereof, are intended to cover a nonexclusive inclusion such that a process, method, or product that comprises a list of elements does not necessarily include only those elements, but may include other elements not expressly listed or inherent to such a process, method, article, or apparatus. Relative terms, such as, "substantially" and "generally," are used to indicate a possible variation of ±5% of a stated or understood value.

In addition, throughout the specification, when a portion is referred to as being "connected" or "coupled" to another portion, it is not limited to the case that they are "directly connected" or "directly coupled", but it also includes the case where they are "indirectly connected" or "indirectly coupled" with one or more elements being arranged between them.

Additionally, the term " . . . unit" as used herein refers to a processing unit of at least one function or operation, and this may be implemented by hardware and software either alone or in combination.

FIG. 1 is a diagram exemplarily showing a battery diagnosing apparatus, a battery system, and a charging station according to an embodiment of the present disclosure.

Referring to FIG. 1, the battery system 1 includes a system controller 2, a battery pack 10, an inverter 30, and an electric motor 40. Charging and discharging terminals P+ and P− of the battery pack 10 may be electrically connected to a charging station 300 through a charging cable or the like. The battery system 1 is not particularly limited as long as it is an electric system in which a battery is used as a power source, such as an electric vehicle.

The system controller 2 (e.g., ECU: Electronic Control Unit) is configured to transmit a key-on signal to the battery management system 100 in response to that a start button (not shown) provided in the battery system 1 is switched to an ON position by a user. The system controller 2 is configured to transmit a key-off signal to the battery management system 100 in response to that the start button is switched to an OFF position by the user. The charging station 300 may communicate with the system controller 2 and supply a charging power selected from a constant power, a constant current, and a constant voltage through the charging and discharging terminals P+ and P− of the battery pack 10.

The battery pack 10 includes a battery 11, a relay 20, and a battery management system 100.

The battery 11 includes at least one battery cell BC. In FIG. 1, the battery 11 is exemplarily shown as including a plurality of battery cells ($BC_1$ to $BC_N$, N is a natural number of 2 or more) connected in series. The plurality of battery cells ($BC_1$ to $BC_N$) may be provided to have the same electrochemical specifications. Hereinafter, when explaining features common to the plurality of battery cells ($BC_1$ to $BC_N$), the reference sign 'BC' will be endowed to the battery cell. The charging station 300 may execute charging and discharging cycles necessary to diagnose the battery cell BC through collaboration with the inverter 30 having a discharging function.

The battery cell BC includes a positive electrode and a negative electrode. The battery cell BC may include at least one unit cell as an electrochemical element capable of repeatedly charging and discharging. The battery cell BC is a target of diagnosis by the battery diagnosing apparatus 302.

The relay 20 is electrically connected in series to the battery 11 through a power path that connecting the battery 11 and the inverter 30. In FIG. 1, the relay 20 is illustrated as connected between the positive electrode terminal of the battery 11 and the charging and discharging terminal P+. The relay 20 is controlled to turn on and off in response to a switching signal from the battery management system 100. The relay 20 may be a mechanical contactor turned on and off by the magnetic force of a coil, or a semiconductor switch such as a MOSFET (Metal Oxide Semiconductor Field Effect transistor).

The inverter 30 is provided to convert DC current from the battery 11 included in the battery pack 10 into AC current in response to a command from the battery management system 100 or the system controller 2. The electric motor 40 is driven using AC current power from the inverter 30. As the electric motor 40, for example, a three-phase AC current motor may be used. The components in the battery system 1 that receive a discharging power from the battery 11, such as the inverter 30 and the electric motor 40, may be collectively referred to as electric loads.

The battery management system 100 includes a sensing unit 110 and a control circuit 130. The battery management system 100 may further include a communication circuit 150.

The sensing unit 110 includes a voltage sensor 111. The sensing unit 110 may further include a current sensor 112. The sensing unit 110 may generate voltage measurement information and current measurement information, explained later.

The voltage sensor 111 is connected to the positive electrode terminal and the negative electrode terminal of the battery cell BC, and is configured to detect the voltage across both ends of the battery cell BC (also referred to as 'full-cell voltage') and generate a voltage signal representing the detection value of the detected voltage. The voltage sensor 111 may be implemented as one or a combination of at least two of known voltage detection elements such as a voltage measurement IC.

The current sensor 112 is connected in series to the battery 11 through a current path between the battery 11 and the inverter 30. The current sensor 112 is configured to detect the current (also referred to as a 'charging and discharging current') flowing through the battery 11 and generate a current signal representing the detection value of the detected current. Since the plurality of battery cells (BC$_1$ to BC$_N$) are connected in series, the current flowing in the battery 11 is the same as the current flowing in the battery cell BC. The current sensor 112 may be implemented as one or a combination of at least two of known current detection elements such as a shunt resistor, a Hall effect element, etc.

The communication circuit 150 is configured to support wired or wireless communication between the control circuit 130 and the system controller 2. The wired communication may be, for example, CAN (Controller Area Network) communication, and the wireless communication may be, for example, ZigBee or Bluetooth communication. The type of communication protocol is not particularly limited as long as it supports wired and wireless communication between the control circuit 130 and the system controller 2. The communication circuit 150 may include an output device (e.g., a display, a speaker) that provides information received from the control circuit 130 and/or the system controller 2 in a form recognizable to the user (driver).

The control circuit 130 is operably coupled to the relay 20, the voltage sensor 111, and the communication circuit 150. The operable coupling of two components means that the two components are connected directly or indirectly to enable transmission and reception of signals in one direction or two directions.

The control circuit 130 may collect the voltage signal from the voltage sensor 111 and the current signal from the current sensor 112. In this specification, the detection signal may a term referring only to a voltage signal, or a term collectively referring to a voltage signal and a current signal. That is, the control circuit 130 may convert each analog signal collected from the sensors 111 and 112 into a digital value using an ADC (Analog to Digital Converter) provided therein and record the digital value. Alternatively, each of the voltage sensor 111 and the current sensor 112 may include an ADC therein and transmit a digital value to the control circuit 130.

The control unit 130 may be called a 'battery controller', and may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The memory 131 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory 131 may store data and programs required for calculation operations by the control circuit 130. The memory 131 may store data representing the result of a calculation operation performed by the control circuit 130.

When the relay 20 is turned on, the battery 11 goes into a charging mode or a discharging mode. If the relay 20 is turned off while the battery 11 is being used in the charging mode or the discharging mode, the battery 11 switches to a rest mode.

The control circuit 130 may turn on the relay 20 in response to a key-on signal. The control circuit 130 may turn off the relay 20 in response to a key-off signal. The key-on signal is a signal that requests switching from the rest mode to the charging or discharging mode. The key-off signal is a signal that requests switching from the charging or discharging mode to the resting mode. Alternatively, the system controller 2 may be responsible for turning on/off the relay 20 instead of the control circuit 130.

In this specification, measurement information (e.g., time series data) of a certain parameter indicates the change history of the parameter over time. In addition, a profile (or curve), which represents the correspondence of any two parameters obtained at the same timing in the same period, may be a mapping of two measurement information of two parameters so that they may be expressed in the form of a two-dimensional graph, or may be a polynomial equation obtained by applying a predetermined curve fitting logic to the set two mapped measurement information. Here, the degree of the highest term of the polynomial equation may be predetermined.

The battery diagnosing apparatus 302 includes a data obtaining unit 310, a processor 320, and a memory unit 330.

The charging station 300 may include a stimulation applying device 301 and a battery diagnosing apparatus 302. Alternatively, the battery diagnosing apparatus 302 may be configured independently from the charging station 300. For example, the battery diagnosing apparatus 302 may be provided to be included in a remote diagnosing server (not shown), a battery pack 10, or a battery system 1. The remote diagnosing server may be placed remotely from the charging station 300. When the battery diagnosing apparatus 302 is included in the remote diagnosing server, the data obtaining unit 310 of the battery diagnosing apparatus 302 may perform diagnostic procedures for the battery cell BC through remote communication with the stimulation applying device 301 and/or the battery system 1.

If the battery diagnosing apparatus 302 is included in the battery pack 10 instead of the charging station 300 or the remote diagnosing server, the battery management system 100 may be omitted from the battery pack 10. In other words, the processor 320 may be responsible for all functions of the control circuit 130 of the battery management system 100. For example, the data obtaining unit 310 may be included as a sub-component of the processor 320 and may be responsible for all functions of the communication circuit 150 of the battery management system 100. Also, the data obtaining unit 310 may collect voltage measurement information and current measurement information from the sensing unit 110.

The stimulation applying device 301 may include a charger that provides a charging power for normal charging of the battery pack 10. The stimulation applying device 301, alone or in collaboration with the inverter 30, may apply various electric stimulation to the battery cell BC for diagnosis of the battery cell BC.

The data obtaining unit 310 is configured to support wired or wireless communication between the processor 320 and the system controller 2. The data obtaining unit 310 may transmit the result of diagnosis for the battery cell BC performed by the processor 320 to the battery system 1.

In terms of hardware, the processor 320 may be implemented using at least one of ASICs (application specific integrated circuits), DSPs (digital signal processors), DSPDs (digital signal processing devices), PLDs (programmable logic devices), FPGAs (field programmable gate arrays), microprocessors, and electrical units for performing other functions.

The apparatus 300 and the system 1 disclosed in connection with embodiments of FIGS. 1 to 20 and the various elements therein comprised, which enable the implementation of methods and processes in accordance with the present disclosure, may be implemented by the processor 320 using a plurality of microprocessors executing software or firmware, or may be implemented using one or more application specific integrated circuits (ASICs) and related software. In other examples, the apparatus 300 or system 1 and the various elements therein comprised, which enable the implementation of methods and processes in connection with embodiments of FIGS. 1 to 20, may be implemented using a combination of ASICs, discrete electronic components (e.g., transistors), and microprocessors. In some embodiments, components shown as separate may be replaced by a single component. In addition, some of the components displayed may be additional, or may be replaced by other components.

The memory unit 330 may include, for example, at least one type of storage medium among flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory unit 330 may store data representing the result of a calculation operation by the processor 320. The memory unit 330 may store data sets and software used to diagnose the degradation state of the battery cell BC.

In one embodiment, the memory unit 330 may store a set of instructions that can be executed to cause the processor 320 to perform any one or more of the methods or processes based on functionality disclosed in the present disclosure. The memory unit 330 may communicate via one or more electrical wires or buses. Likewise, although not expressly shown, the components shown in FIG. 1 may be coupled to each other via one or more electrical wires and buses, in any suitable manner known by one of ordinary skill in the art, to facilitate signal or data communication and operation of the apparatus 300 or system 1, in accordance with the present disclosure. The memory unit 330 may be a main memory, a static memory, or a dynamic memory. The memory unit 330 may include, but is not limited to computer readable storage media such as various kinds of volatile and non-volatile storage media, including but not limited to random access memory, read-only memory, programmable read-only memory, electrically programmable read-only memory, electrically erasable read-only memory, flash memory, and the like. In one implementation, the memory unit 330 may include a cache or random-access memory for the processor 320. The memory unit 330 may be a cache memory of a processor, the system memory, or other memory. The memory unit 330 may be operable to store instructions executable by the processor 320. The functions, acts or tasks illustrated in the figures or described herein may be performed by the processor 300 executing the instructions stored in the memory unit 330. The functions, acts or tasks are independent of the particular type of instructions set, storage media, processor or processing strategy and may be performed by software, hardware, integrated circuits, firmware, microcode and the like, operating alone or in combination. Likewise, processing strategies may include multiprocessing, multitasking, and the like. The computer readable storage media described in connection with the memory unit 330 in accordance with the present disclosure may be non-transitory, and may be tangible.

Computer-readable media having stored thereon instructions configured to cause one or more computers to perform any of the methods described herein are also described. A computer readable medium may include volatile or nonvolatile, removable or non-removable media implemented in any method or technology capable of storing information, such as computer readable instructions, data structures, program modules, or other data. In general, functionality of computing devices described herein may be implemented in computing logic embodied in hardware or software instructions, which can be written in a programming language, such as C, C++, $CO_{BOL}$, JAVA™, PHP, Perl, Python, Ruby, HTML, CSS, JavaScript, VBScript, ASPX, Microsoft.NET™ languages such as C#, and/or the like. Computing logic may be compiled into executable programs or written in interpreted programming languages. Generally, functionality described herein can be implemented as logic modules that can be duplicated to provide greater processing capability, merged with other modules, or divided into sub modules. The computing logic can be stored in any type of computer readable medium (e.g., a non-transitory medium such as a memory or storage medium) or computer storage device and be stored on and executed by one or more general purpose or special purpose processors, thus creating a special purpose computing device configured to provide functionality described herein.

The applications and the functionalities disclosed in the foregoing and following embodiments may be achieved by programming the apparatus 300 in accordance with the description provided in connection with, for example, the system 1 shown in FIG. 1. That is, the apparatus 300 or system 1 in the foregoing and following embodiments may utilize, for example, a computer-readable media having stored thereon instructions configured to cause one or more computers or processors to perform any of the methods described herein.

In the present disclosure, the target cell, which is a battery cell BC to be diagnosed, includes a positive electrode and a negative electrode, and at least one of the positive electrode material of the positive electrode and the negative electrode material of the negative electrode includes at least two kinds of active materials.

The positive electrode active material includes, for example, $Li_2MnO_3$, $LiNi_aCo_bMn_cO_2$ (a, b, c≥0; a+b+c=1), $LiFe_xMn_{1-x}PO_4$ (x≥0), etc. The so-called manganese-rich (Mn-rich) may be a positive electrode active material in which the specific gravity (c) of manganese in $LiNi_aCo_bMn_cO_2$, which is a ternary (NMC) positive electrode material, is increased to a certain value (e.g., 0.5) or higher. $LiFe_xMn_{1-x}PO_4$ may be referred to as a LMFP positive electrode material.

The negative electrode active material includes, for example, graphite and silicon-based active materials (e.g., Pure Si, SiO, SiC, etc.)

In this specification, the new product state has the same concept as the BOL (Beginning Of Life) state. For example, it may be called the BOL state until the cumulative charging and discharging capacity reaches a predetermined setting capacity from the time of completion of manufacturing, and it may be called the MOL (Middle Of Life) state after the cumulative charging and discharging capacity reaches the set capacity.

Figure 2:
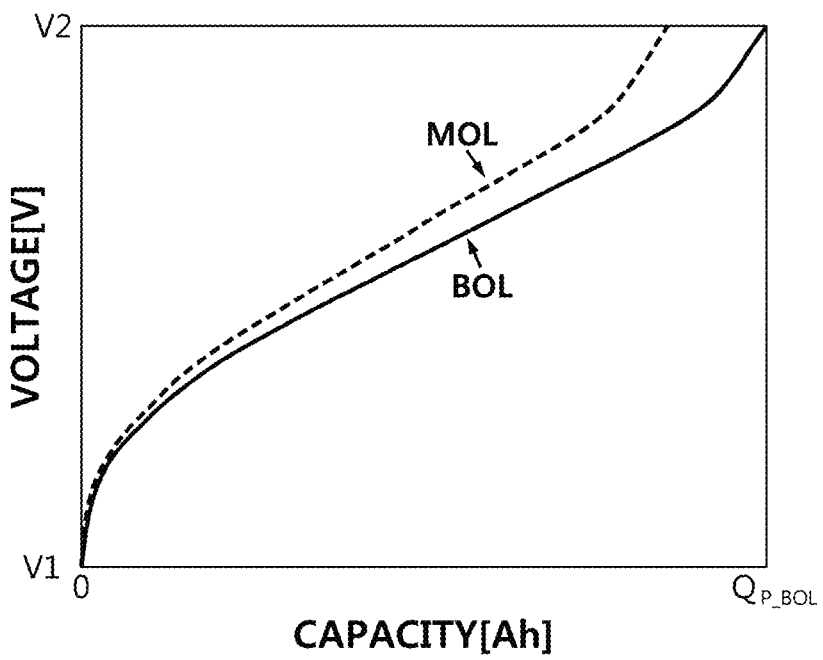
FIGS. 2 and 3 are diagrams referenced to describe a capacity-voltage relationship of an electrode including a single active material.
Figure 3:
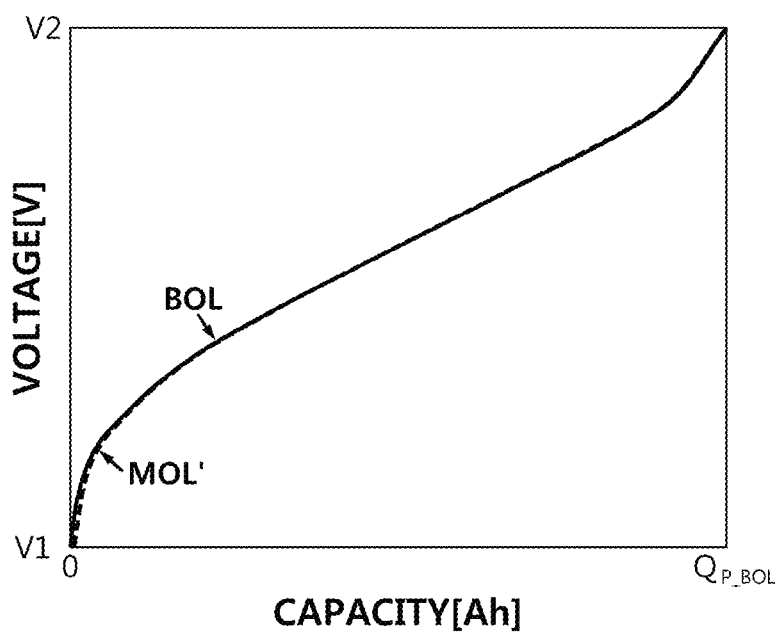

FIGS. 2 and 3 are diagrams referenced to describe a capacity-voltage relationship of an electrode including a single active material.

First, in FIG. 2, the curve indicated by the reference sign BOL shows a positive electrode profile representing the correspondence between the positive electrode voltage and the positive electrode capacity for a predetermined voltage range V1 to V2 when the positive electrode containing only one type of positive electrode active material in the positive electrode material thereof is in the BOL state. The reference sign $Q_{P\_BOL}$ indicates a total positive electrode capacity in the BOL state of the positive electrode. In FIG. 2, the curve indicated by the reference sign MOL is a positive electrode profile representing the correspondence between the positive electrode voltage and the positive electrode capacity for the predetermined voltage range V1 to V2 when the positive electrode containing only one type of positive electrode active material is in the MOL (Middle Of Life) state. The MOL state is a state degraded from the BOL state. Therefore, the positive electrode capacity when the positive electrode voltage of the positive electrode profile MOL reaches V2 is less than $Q_{P\_BOL}$.

Next, in FIG. 3, the curve indicated by the reference sign BOL is the same as the positive electrode profile BOL shown in FIG. 2. In addition, the curve indicated by the reference sign MOL' is the result of enlarging the positive electrode profile MOL shown in FIG. 2 along the horizontal axis to have a capacity range consistent with the capacity range of the positive electrode profile BOL.

It should be noted that the positive electrode profile MOL' is almost identical to the positive electrode profile BOL. Specifically, over the entire capacity range (0 to $Q_{P\_BOL}$), the voltage difference between the positive electrode profile MOL' and the positive electrode profile BOL is maintained close to 0. In other words, if only one type of positive electrode active material is included in the positive electrode material, the overall form of the positive electrode profile in the MOL state is almost unchanged compared to the BOL state. Therefore, assuming that $V_{P\_BOL}$ (Q) represents a polygonal equation corresponding to the positive electrode profile in the BOL state and $V_{P\_BOL}$ (Q) represents a polygonal equation corresponding to the positive electrode profile in the MOL state, it may be regarded that the following two relational expressions are satisfied.

$$V_{P\_MOL}(Q) = V_{P\_BOL}(Q \times Q_{P\_BOL}/Q_{P\_MOL}) \quad \text{[Relational Expression 1]}$$

$$V_{P\_BOL}(Q) = V_{P\_MOL}(Q \times Q_{P\_MOL}/Q_{P\_BOL}) \quad \text{[Relational Expression 2]}$$

$V_{P\_MOL}$ (Q) represents the positive electrode voltage of the positive electrode profile MOL corresponding to the positive electrode capacity Q. $V_{P\_MOL}$ (Q) represents the positive electrode voltage of the positive electrode profile BOL corresponding to the positive electrode capacity Q. $Q_{P\_MOL}$ represents the positive electrode capacity when the positive electrode voltage of the positive electrode profile MOL is V2, namely the total positive electrode capacity in the MOL state.

Figure 4:
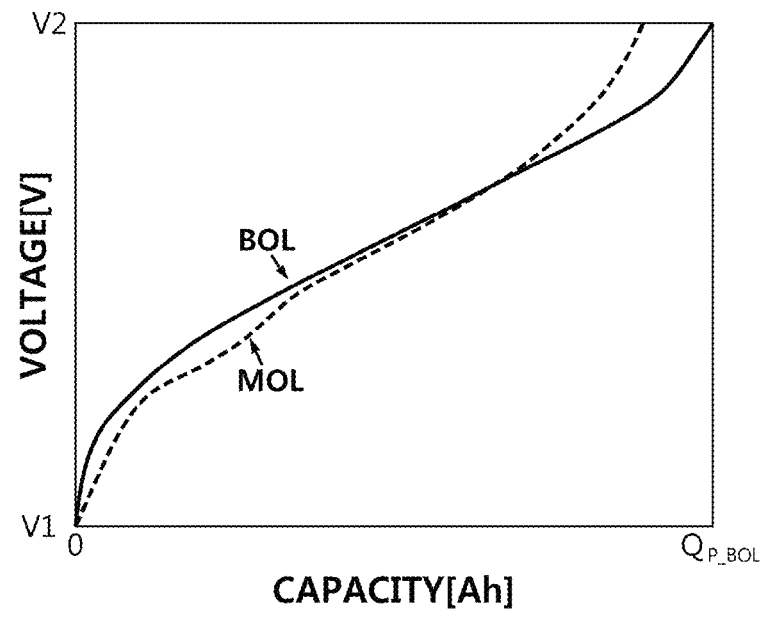
FIGS. 4 and 5 are diagrams referenced to describe a capacity-voltage relationship of an electrode including a plurality of active materials.
Figure 5:
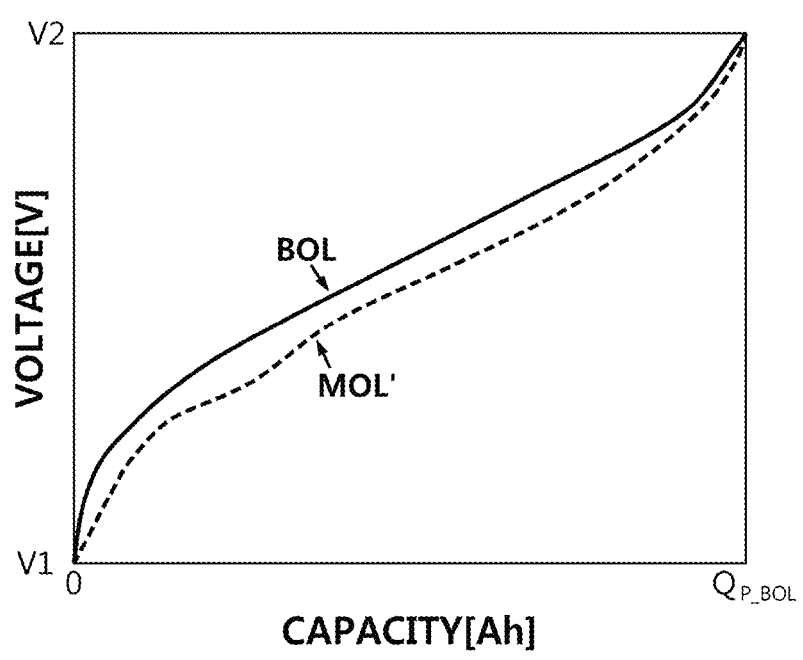

FIGS. 4 and 5 are diagrams referenced to describe a capacity-voltage relationship of an electrode including a plurality of active materials.

First, in FIG. 4, the curve indicated by the reference sign BOL is a positive electrode profile representing the correspondence between the positive electrode voltage and the positive electrode capacity for the predetermined voltage range V1 to V2 when the positive electrode including a plurality of positive electrode active materials is in the BOL state. The reference sign $Q_{P\_BOL}$ indicates the total positive electrode capacity in the BOL state of the positive electrode including a plurality of positive electrode active materials. In FIG. 4, the curve indicated by the reference sign MOL is a positive electrode profile representing the correspondence between the positive electrode voltage and the positive electrode capacity for the predetermined voltage range V1 to V2 when the positive electrode including a plurality of positive electrode active materials is in the MOL (Middle Of Life) state.

Next, in FIG. 5, the curve indicated by the reference sign BOL is identical to the positive electrode profile BOL shown in FIG. 4. In addition, the curve indicated by the reference sign MOL' is the result of enlarging the positive electrode profile MOL shown in FIG. 4 along the horizontal axis to have a capacity range consistent with the capacity range of the positive electrode profile BOL shown in FIG. 4.

In contrast to FIG. 3, in FIG. 5, there is a significant difference in the positive electrode profile MOL' compared to the positive electrode profile BOL. Specifically, the section where the voltage difference between the positive electrode profile MOL' and the positive electrode profile BOL is so large not to be ignored is widely distributed within the entire capacity range (0 to $Q_{P\_BOL}$). That is, when the positive electrode material includes at least two kinds of positive electrode active materials, the overall form of the positive electrode profile in the MOL state changes significantly compared to the BOL state. Therefore, the two relational expressions described above are not effective for the positive electrode including a plurality of positive electrode active materials.

Meanwhile, the contents of the positive electrode described with reference to FIGS. 2 to 5 are also common to the negative electrode.

FIGS. 6 to 9 are diagrams referenced to describe an electrode profile map used in the diagnosis of a battery cell.

The electrode profile map may include a plurality of electrode profiles. Each electrode profile in the electrode profile map may be associated with the positive electrode or the negative electrode of the target cell BC.

Figure 8:
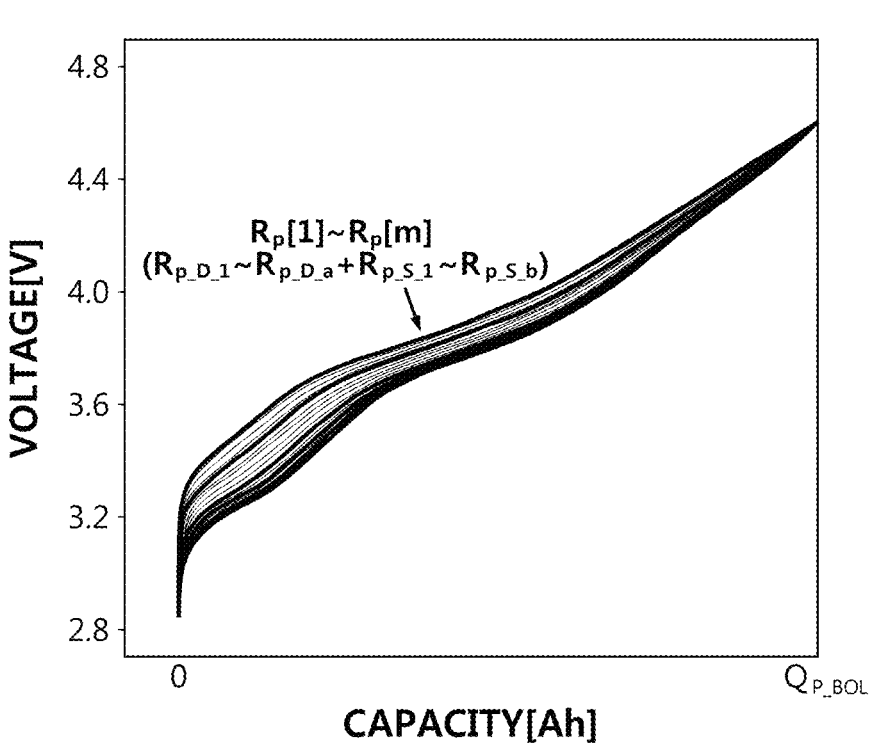
Figure 9:
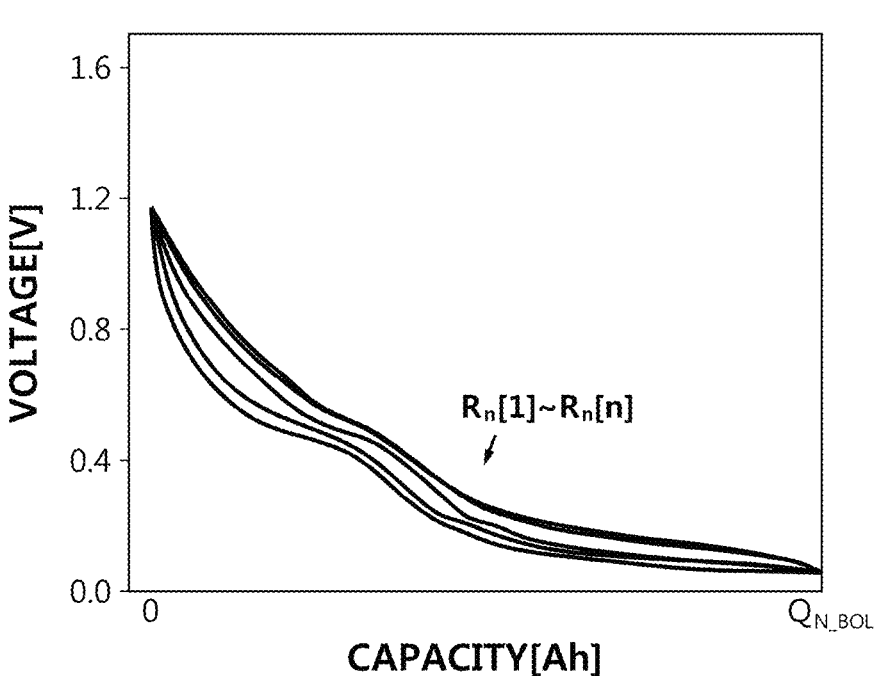

Referring to FIGS. 8 and 9, m reference positive electrode profiles (Rp[1] to Rp[m]) and n reference negative electrode profiles (Rn[1] to Rn[n]) may be confirmed, and they may be electrode profiles included in the electrode profile map. m and n are natural numbers of 2 or more, respectively. Rp[1] may be a reference positive electrode profile representing the capacity-voltage characteristic of the positive electrode in the BOL state. Rn[1] may be a reference negative electrode profile representing the capacity-voltage characteristic of the negative electrode in the BOL state.

The electrode profile map may be stored in advance in the memory unit 330 or may be received from the outside through a communication channel by the data obtaining unit 310.

Figure 6:
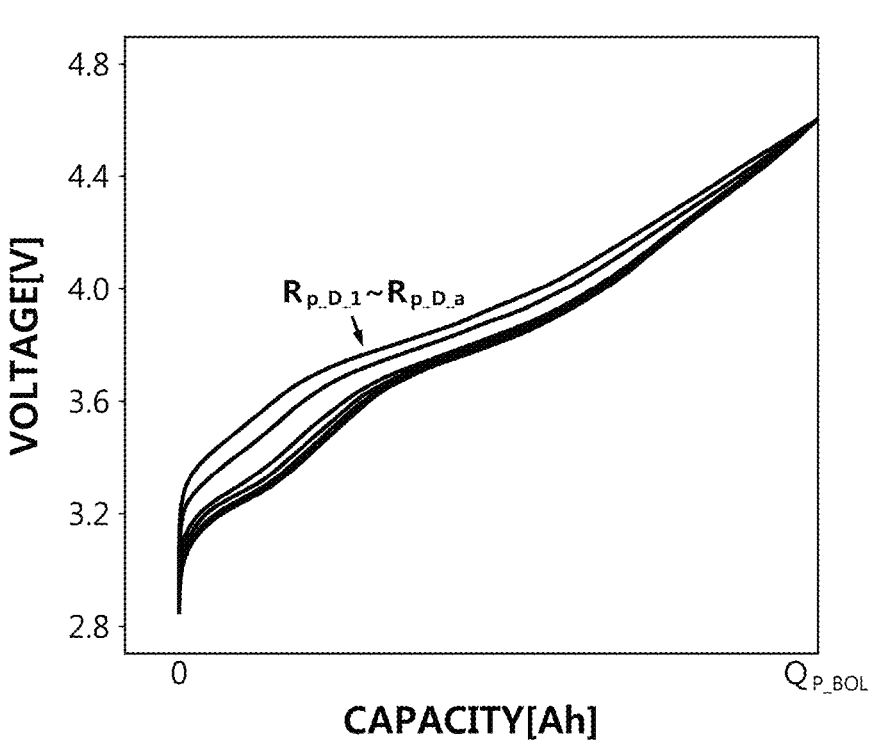
FIGS. 6 to 9 are diagrams referenced to describe an electrode profile map used in the diagnosis of a battery cell.

FIG. 6 show a degradation positive electrode profiles ($R_{p\_D\_1}$ to $R_{p\_D\_a}$). a is a natural number of 2 or more and m or less. The degradation positive electrode profiles ($R_{p\_D\_1}$ to $R_{p\_D\_a}$) are associated with a plurality of degradation states of the positive electrode of the target cell BC.

The degradation positive electrode profiles ($R_{p\_D\_1}$ to $R_{p\_D\_a}$) may be obtained in advance based on the results of tests previously performed on the reference cell(s). The reference cell may be manufactured to have the same level of positive electrode performance and negative electrode performance as a new battery cell that has been verified as a good product. The new battery cell refers to a battery cell in a new product state.

In detail, the degradation positive electrode profile ($R_{p\_D\_1}$ to $R_{p\_D\_a}$) may be prepared in advance based on the measurement information representing the capacity-voltage relationship of a positive electrode half-cell forcibly degraded from the BOL state through various cycling tests. The positive electrode half-cell may be a positive electrode of a reference cell manufactured to have the same electrochemical specifications as the target cell BC.

Each cycling test may be different from other cycle tests in terms of at least one of a temperature condition, a charging and discharging voltage range condition, and a charging and discharging current rate condition. As an example, the first degradation positive electrode profile ($R_{p\_D\_1}$) may be based on the capacity-voltage measurement information of the positive electrode half-cell obtained by disassembling the reference cell at which a charging and discharging cycle where the temperature condition, the charging and discharging voltage range condition, and the charging and discharging current rate condition are set to 25 [C], 4.6 to 2.0 [V] and 2 [C], respectively, is performed a predetermined number of times. As another example, the $a^{th}$ degradation positive electrode profile ($R_{p\_D\_a}$) may be based on the capacity-voltage measurement information of a positive electrode half-cell obtained by disassembling another reference cell at which a charging and discharging cycle where the temperature condition, the charging and discharging voltage range condition, and the charging and discharging current rate condition are set to 35[° C.], 4.5 to 2.0 [V] and 1 [C], respectively, is performed a predetermined number of times.

When the positive electrode of the target cell BC contains at least two kinds of active materials, at least two (e.g., $R_{p\_D\_1}$, $R_{p\_D\_a}$) among the degradation positive electrode profiles ($R_{p\_D\_1}$ to $R_{p\_D\_a}$) may be included in the electrode profile map as reference positive electrode profiles. For example, $R_{p\_D\_1}=Rp[2]$, $R_{p\_D\_a}=Rp[m]$.

Figure 7:
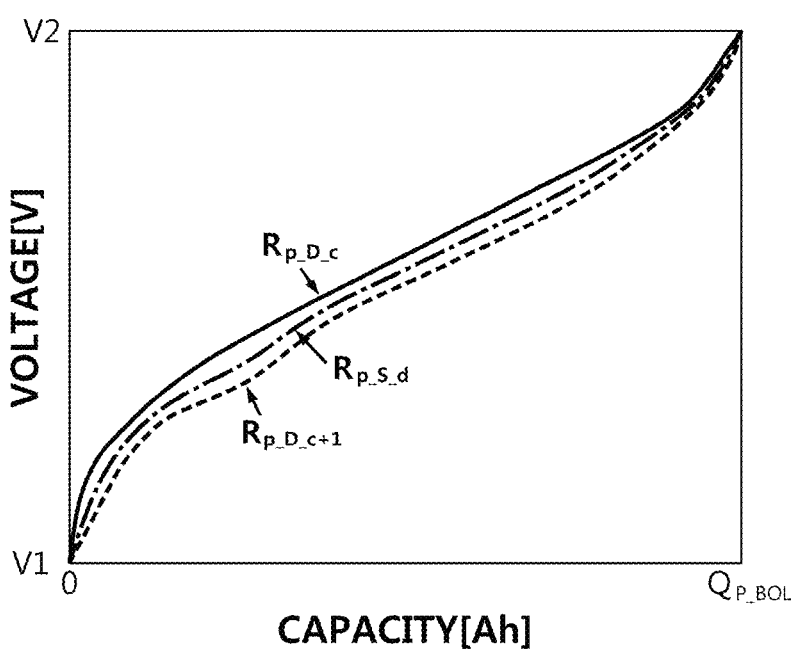

Referring to FIG. 7, when c is a natural number less than a, two degradation positive electrode profiles ($R_{p\_D\_c}$, $R_{p\_D\_c}+1$) have a non-small voltage difference over the entire capacity range. The comparison value between the two degradation positive electrode profiles $R_{p\_D\_c}$, $R_{p\_D\_c}+1$) may exceed a predetermined threshold value, which may be due to the deviation in degradation characteristics of the at least two kinds of positive electrode active materials of the positive electrode material. The comparison value between any two profiles may be referred to as 'profile error'.

At least one of the reference positive electrode profiles (Rp[1] to Rp[m] may be a simulation positive electrode profile. The simulation positive electrode profile may be obtained by synthesizing at least two degradation positive electrode profiles among the degradation positive electrode profiles ($R_{p\_D\_1}$ to $R_{p\_D\_a}$) at a predetermined ratio. For example, in FIG. 7, when d is a natural number less than or equal to b, the simulation positive electrode profile ($R_{p\_s\_d}$) is a new positive electrode profile obtained by synthesizing two degradation positive electrode profiles ($R_{p\_D\_c}$, $R_{p\_D\_c}+$ 1) at a ratio of 0.5:0.5.

Of course, by synthesizing the two degradation positive electrode profiles ($R_{p\_D\_c}$, $R_{p\_D\_c+1}$) at various ratios such as 0.1:0.9, 0.2:0.8, or the like, an additional simulation positive electrode profile(s) located between the degradation positive electrode profiles ($R_{p\_D\_c}$, $R_{p\_D\_c+1}$) may be generated. As an example, as the two degradation positive electrode profiles ($R_{p\_D\_c}$, $R_{p\_D\_c+1}$) are individually synthesized at a plurality of ratios, a predetermined number of simulation positive electrode profiles positioned at equal intervals between the two degradation positive electrode profiles ($R_{p\_D\_c}$, $R_{p\_D\_c+1}$) may be generated.

Since the degradation positive electrode profiles ($R_{p\_D\_c}$, $R_{p\_D\_c+1}$) are associated with different degradation states, each simulation positive electrode profile is also associated with the degradation state of a positive electrode that is different from those of the degradation positive electrode profiles ($R_{p\_D\_c}$, $R_{p\_D\_c+1}$).

Each simulation positive electrode profile may already be included in the electrode profile map. Alternatively, the processor 320 may generate at least one simulation positive electrode profiles based on two degradation positive electrode profiles included in the electrode profile map, and add each generated simulation positive electrode profile to the electrode profile map.

FIG. 8 illustrates that the set of degradation positive electrode profiles ($R_{p\_D\_1}$ to $R_{p\_D\_a}$) and b simulation positive electrode profiles ($R_{p\_s\_1}$ to $R_{p\_s\_b}$) are m reference positive electrode profiles (Rp[1] to Rp[m]). In this case, m=a+b.

When the negative electrode of the target cell BC contains at least two kinds of negative electrode active materials, the reference negative electrode profiles (Rn[1] to Rn[n]) shown in FIG. 9 may be prepared in advance by commonly applying the method described above in relation to the reference positive electrode profiles (Rp[1]) to Rp[m]) to the negative electrode of the reference cell. For example, at least two of the reference negative electrode profiles (Rn[1] to Rn[n]) may be degradation negative electrode profiles prepared in advance based on the measurement information representing the capacity-voltage relationship of a negative electrode half-cell forcibly degraded from the BOL state by various cycling tests. The negative electrode half-cell may be the negative electrode of the reference cell. In FIG. 9, $Q_{N\_BOL}$ indicates the total negative electrode capacity of the negative electrode including a plurality of negative electrode active materials in the BOL state.

Similar to the reference positive electrode profiles (Rp[1] to Rp[m]), the reference negative electrode profiles (Rn[1] to Rn[n]) are associated with the plurality of degradation states of the negative electrode. In addition, the comparison value between at least two of the reference negative electrode profiles (Rn[1] to Rn[n]) may exceeds a threshold value due to the deviation of degradation characteristics of the negative electrode active materials included in the negative electrode half-cell.

The threshold value becomes a standard for determining whether it is difficult to trust the diagnosis result according to the diagnostic procedures, explained later, due to excessive variation in degradation characteristics between at least two active materials. As described above, electrodes containing at least two kinds of active materials have greatly different capacity-voltage relationships between the plurality of degradation states. Accordingly, the form of the electrode profile in one degradation state is significantly different from the form of the electrode profile in another degradation state, and the comparison value is a quantified value indicating the degree of difference in form between these two profiles. Therefore, the fact that the comparison value between any two reference positive electrode profiles included in the electrode profile map is greater than or equal to the threshold value indicates that the positive electrode of the target cell BC contains at least two kinds of active materials. Likewise, the fact that the comparison value between any two reference negative electrode profiles included in the electrode profile map is greater than or equal to the threshold value indicates that the negative electrode of the target cell BC contains at least two kinds of active materials.

If the positive electrode of the target cell BC contains at least two kinds of active materials, the processor 320 may determine a comparison value between at least two of the m reference positive electrode profiles (Rp[1] to Rp[m]).

If the negative electrode of the target cell BC contains at least two kinds of active materials, the processor 320 may determine a comparison value between at least two of the reference negative electrode profiles (Rn[1] to Rn[n]).

Meanwhile, it is not necessary for both the positive electrode and the negative electrode of the target cell BC to contain at least two kinds of active materials to be the diagnosis target according to the present disclosure, and the target cell BC may be the diagnosis target when only one of the positive electrode and the negative electrode contains at least two kinds of active materials. Therefore, if the positive electrode of the target cell BC contains at least two kinds of active materials and the negative electrode contains only one type of active material, n=1, and in this case, it is sufficient that only a single reference negative electrode profile (e.g., Rn[1]) representing the capacity-voltage characteristic of the negative electrode in the BOL state is prepared. Likewise, if the negative electrode of the target cell BC contains at least two kinds of active materials and the positive electrode contains only one type of active material, m=1, and in this case, it is sufficient that only a single reference positive electrode profile (e.g., Rp[1]) representing the capacity-voltage characteristic of the positive electrode in the BOL state is prepared.

For reference, as the positive electrode or the negative electrode deteriorates more, the voltage changes greater due to the change in capacity. Considering this, each of the reference positive electrode profiles (Rp[1] to Rp[m]) may be standardized to have the same positive electrode capacity range as the positive electrode capacity range (0 to $Q_{P\_BOL}$) of the positive electrode profile in the BOL state. Also, each of the reference negative electrode profiles (Rn[1] to Rn[n]) may be standardized to have the same negative electrode capacity range as the negative electrode capacity range (0 to $QN_{-BOL}$) of the negative electrode profile in the BOL state. This may also be confirmed by the fact that that both end points of the reference positive electrode profiles (Rp[1] to Rp[m]) in FIG. 8 match and both end points of the reference negative electrode profiles (Rn[1] to Rn[n]) in FIG. 9 match.

Although not shown in FIG. 9, the electrode profile map may include a plurality of reference full-cell profiles. Each reference full-cell profile is a profile in which one of the m reference positive electrode profiles (Rp[1] to Rp[m]) and one of the n reference negative electrode profiles (Rn[1] to Rn[n]) are synthesized, and represents the correspondence between the full-cell capacity and the full-cell voltage when the reference cell is in a specific degradation state.

For example, after the capacity-voltage measurement information of a reference cell that is forcibly deteriorated is obtained by a specific cycling test, the capacity-voltage measurement information of each of the positive electrode and the negative electrode obtained by disassembling the corresponding reference cell may be obtained. After completion of a specific cycling test, the reference full-cell profile determined from the capacity-voltage measurement information of the reference cell, the reference positive electrode profile determined based on the capacity-voltage measurement information of the positive electrode of the reference cell, and the reference negative electrode profile determined based on the capacity-voltage measurement information of the negative electrode of the reference cell may be included in the electrode profile map.

Figure 10:
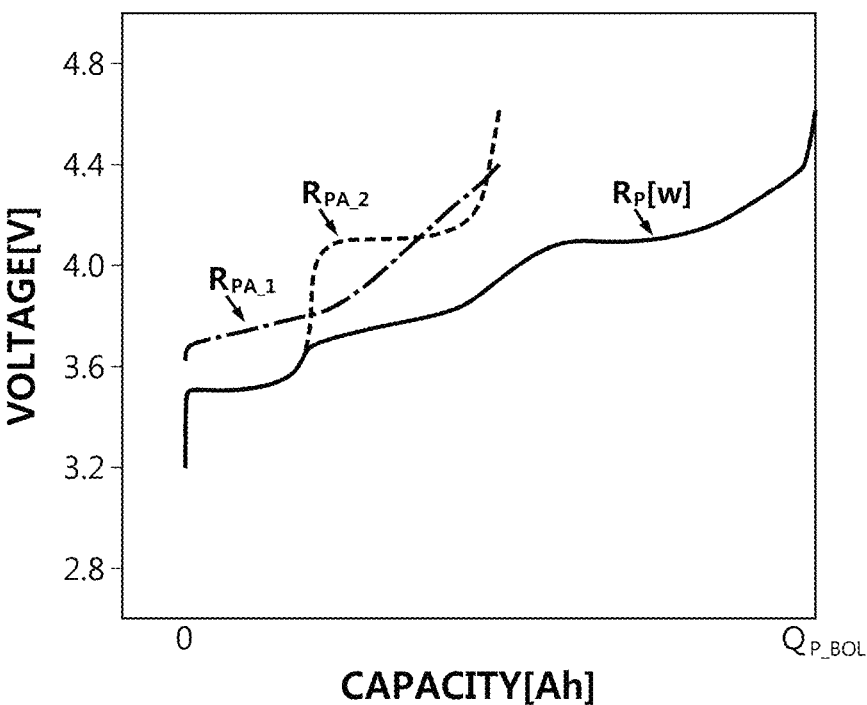
FIG. 10 is a diagram showing an example of generating a reference positive electrode profile by synthesizing a plurality of positive electrode active material profiles.
Figure 11:
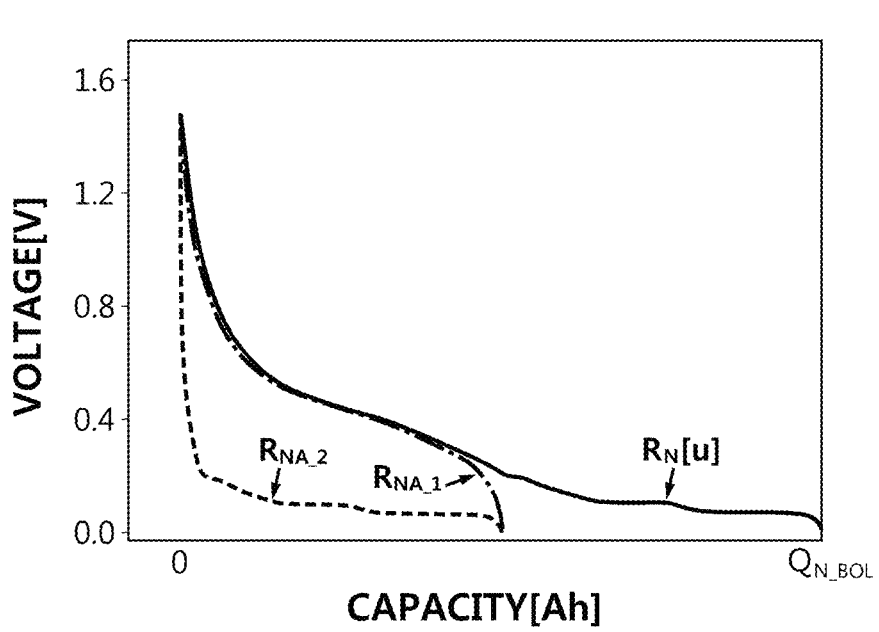
FIG. 11 is a diagram showing an example of generating a reference negative electrode profile by synthesizing a plurality of negative electrode active material profiles.

FIG. 10 is a diagram showing an example of generating a reference positive electrode profile by synthesizing a plurality of positive electrode active material profiles, and FIG. 11 is a diagram showing an example of generating a reference negative electrode profile by synthesizing a plurality of negative electrode active material profiles.

First, referring to FIG. 10, the curve ($R_{P4\_1}$) is an example of the active material profile of the first positive electrode active material, and the curve ($R_{P4\_2}$) is an example of the active material profile of the second positive electrode active material. The first positive electrode active material may be an NMC positive electrode material, and the second positive electrode active material may be an LMFP positive electrode material. The available capacity per unit weight of the first positive electrode active material and the second positive electrode active material may be already known values.

The active material profile of a specific positive electrode active material represents the capacity-potential characteristic of a positive electrode half-cell manufactured to contain only the specific positive electrode active material by a predetermined weight as a positive electrode active material. The active material profile ($R_{P4\_1}$) may be predetermined through a capacity-potential measurement procedure for a positive electrode half-cell manufactured using the first positive electrode active material of the first weight. The active material profile ($R_{P4\_2}$) may be predetermined through a capacity-potential measurement procedure for a positive electrode half-cell manufactured using the second positive electrode active material of the second weight. To facilitate understanding, the two active material profiles ($R_{P4\_1}$, $R_{P4\_2}$) are shown as standardized so that the capacity ranges thereof match each other as 0 to $Q_{P\_BOL}/2$[Ah].

Assuming that the positive electrode material of the target cell BC includes two kinds of positive electrode active materials (first positive electrode active material and second positive electrode active material), when the two active material profiles ($R_{P4\_1}$, $R_{P4\_2}$) are synthesized, the positive electrode profile for the target cell BC may be obtained. The positive electrode profile (Rp[w]) is the result of synthesizing two active material profiles ($R_{P4\_1}$, $R_{P4\_2}$) at 1:1. When W is a natural number less than or equal to m, the positive electrode profile (Rp[w]) may be one of the m reference positive electrode profiles (Rp[1] to Rp[m]).

Next, referring to FIG. 11, the curve ($R_{N4\_1}$) is an example of the active material profile of the first negative electrode active material, and the curve ($R_{N4\_2}$) is an example of the active material profile of the second negative electrode active material. The first negative electrode active material may be graphite, and the second negative electrode active material may be SiO. The available capacity per unit weight of the first negative electrode active material and the second negative electrode active material may be already known values.

The active material profile of a specific negative electrode active material represents the capacity-potential character-istic of a negative electrode half-cell manufactured to con-tain only the specific negative electrode active material by a predetermined weight as a negative electrode active mate-rial. The active material profile ($R_{NA\_1}$) may be predeter-mined through a capacity-potential measurement procedure for a negative electrode half-cell manufactured using the first negative electrode active material of the third weight. The active material profile ($R_{NA\_2}$) may be predetermined through a capacity-potential measurement procedure for a negative electrode half-cell manufactured using the second negative electrode active material of the fourth weight. To facilitate understanding, the two active material profiles ($R_{NA\_1}$, $R_{NA\_2}$) are shown as standardized so that the capac-ity ranges thereof match each other as 0 to QN_BOL/2 [Ah].

Assuming that the negative electrode material of the target cell BC includes two kinds of negative electrode active materials (first negative electrode active material and second negative electrode active material), when the two active material profiles ($R_{NA\_1}$, $R_{NA\_2}$) are synthesized, the negative electrode profile of the target cell BC may be obtained. The negative electrode profile (Rn[u]) is the result of synthesizing two active material profiles ($R_{NA\_1}$, $R_{NA\_2}$) at 1:1. When u is a natural number less than or equal to n, the negative electrode profile (Rn[u]) may be any one of the n reference negative electrode profiles (Rn[1] to Rn[n]).

When an electrode profile for a specific electrode is generated by synthesizing any two active material profiles for a specific electrode among the positive electrode and the negative electrode, the capacity of the electrode profile at a specific potential may be equal to the sum of two capacity values of the two active material profiles at a specific potential.

To generalize this, when the positive electrode material or the negative electrode material includes the first to $s^{th}$ active materials (s is a natural number of 2 or more), the capacity-potential characteristic of the electrode profile generated through a procedure of synthesizing the first to $s^{th}$ active material profiles individually associated with the first to $s^{th}$ active materials at the first to $s^{th}$ ratios may follow the following relational expression.

$$Q_E(V_E) = \sum_{h=1}^{s} G_h \times Q_{EA\_h}(V_p)$$

In the above relational expression, $V_E$ may be the poten-tial, $Q_E(V_E)$ may be the electrode capacity of the electrode profile (e.g., Rp[w], Rn[u]) corresponding to the potential $V_E$, and $Q_{EA\_h}(V_E)$ may be the capacity of the $h^{th}$ active material profile corresponding to the potential $V_E$, and $G_n$ may be a synthesis coefficient representing the composition ratio of the $h^{th}$ active material profile. $G_n$ may be a positive number less than 1. The sum of $G_1$ to $G_s$ may be 1.

Figure 12:
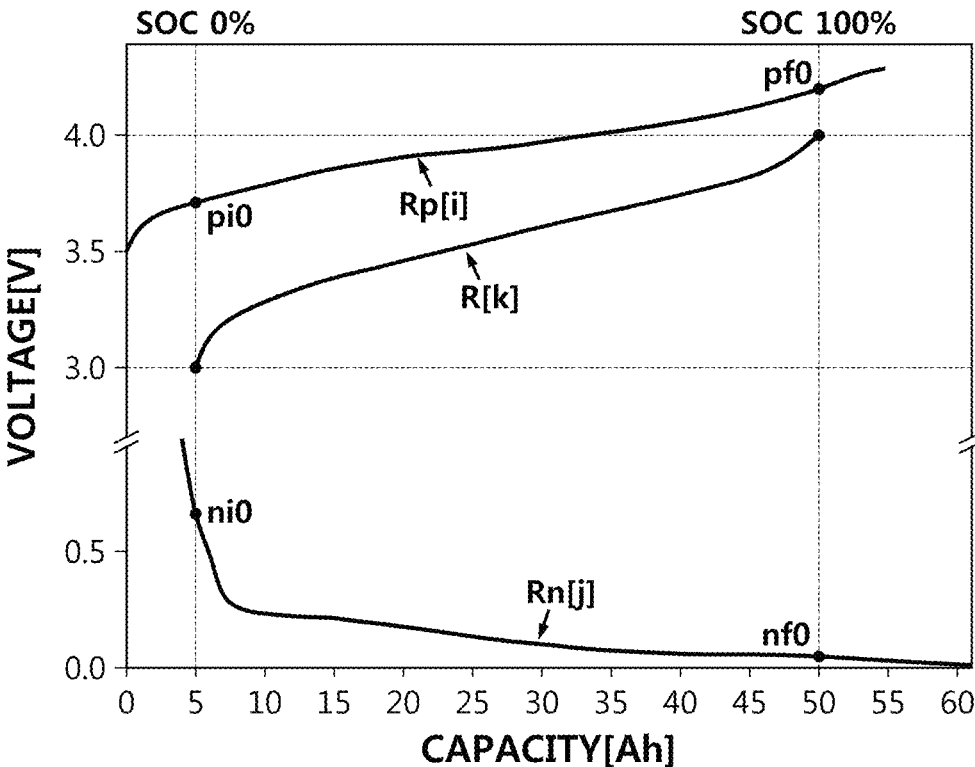
FIG. 12 is a graph referenced to describe an example of each of a reference positive electrode profile and a reference negative electrode profile.

FIG. 12 is a graph referenced to describe an example of each of a reference positive electrode profile and a reference negative electrode profile. In the graph of FIG. 12, the horizontal axis (X-axis) represents capacity (Ah) and the vertical axis (Y-axis) represents voltage. For convenience of explanation, it is assumed that in the graphs of FIGS. 12 and 14 to 20, the numbers marked on the horizontal axis (X axis) represent full-cell capacity during the charging process.

Referring to FIG. 12, the memory unit 330 may store a reference positive electrode profile (Rp[i]) and a reference negative electrode profile (Rn[j]).

When i is a natural number of less than or equal to m, the reference positive electrode profile (Rp[i]) is one of the m reference positive electrode profiles (Rp[1] to Rp[m]) shown in FIG. 8. When j is a natural number less than or equal to n, the reference negative electrode profile (Rn[j]) is one of the n reference negative electrode profiles (Rn[1] to Rn[n]) shown in FIG. 9.

When the m reference positive electrode profiles (Rp[1] to Rp[m]) and the n reference negative electrode profiles (Rn[1] to Rn[n]) are combined, there are a total of m×n pairs, which will be referred to as first to m×n$^{th}$ electrode profile pairs. For example, if m=20 and n=10, the first to 200th electrode profile pairs may be determined from the electrode profile map.

The reference positive electrode profile (Rp[i]) and the reference negative electrode profile (Rn[j]) may be two electrode profiles included in the k$^{th}$ electrode profile pair among the first to m×n$^{th}$ profile pairs. k may be a natural number less than or equal to m×n and may be the same as i×j. As an example, if i=3 and j=2, k=6. As another example, if i=2 and j=1, k=2.

The reference positive electrode profile (Rp[i]) may be a profile representing the correspondence between the positive electrode voltage and the positive electrode capacity of the reference cell. The positive electrode voltage of the refer-ence cell refers to a potential difference between the poten-tial of a reference electrode (not shown) and the potential of the positive electrode of the reference cell. The positive electrode profile may also be referred to as a positive electrode half-cell profile.

The reference negative electrode profile (Rn[j]) may be a profile representing the correspondence between the nega-tive electrode voltage and the negative electrode capacity of the reference cell. The negative electrode voltage of the reference cell refers to a potential difference between the potential of the reference electrode and the potential of the negative electrode of the reference cell. The negative elec-trode profile may also be referred to as a negative electrode half-cell profile.

The potential of the reference electrode (not shown) may be, for example, a redox potential of lithium. The positive electrode voltage may be simply referred to as a positive electrode potential, and the negative electrode voltage may simply be referred to as a negative electrode potential.

Each of the positive electrode voltage and the negative electrode voltage may be an open circuit voltage (OCV) or a closed circuit voltage (CCV).

In this specification, the first electric stimulation refers to electric stimulation that causes a difference between OCV and CCV equal to or smaller than a reference value in the battery cell, and the second electric stimulation refers to electric stimulation that causes a difference between OCV and CCV greater than the reference value in the battery cell. For example, the first electric stimulation may be charging using a first current rate, and the second electric stimulation may be charging using a second current rate greater than the first current rate. As another example, the first electric stimulation may be discharging using a first current rate, and the second electric stimulation may be discharging using a second current rate greater than the first current rate.

At least one of the reference positive electrode profile (Rp[i]) and the reference negative electrode profile (Rn[j])

may be aligned along the horizontal axis so that the synthesis result of a part of the common capacity range (5 to 50 Ah in FIG. 12) of the two profiles (Rp[i], Rn[j]) matches the reference full-cell profile (R[k]). FIG. 12 shows an example in which the reference negative electrode profile (Rn[j]) is aligned to be shifted to the right based on the start point (point corresponding to capacity 0), which is one of both end points of the reference positive electrode profile (Rp[i]).

It may be found from FIG. 12 that both ends of the reference positive electrode profile (Rp[i]) and the reference negative electrode profile (Rn[j]) are offset from each other. In other words, the capacity range of the reference positive electrode profile (Rp[i]) and the capacity range of the reference negative electrode profile (Rn[j]) do not match and only partially overlap. Therefore, the reference full-cell profile (R[k]) indicates the full-cell voltage of a reference cell in a part of the capacity range common to the reference positive electrode profile (Rp[i]) and the reference negative electrode profile (Rn[j]). In other words, the reference full-cell profile (R[k]) is an example of the full-cell voltage profile obtained by directly subtracting a part of the reference negative electrode profile (Rn[j]) from a part of the reference positive electrode profile (Rp[i]).

The reference full-cell profile (R[k]) may represent the correspondence between the full-cell capacity and the full-cell voltage when a new battery cell that is verified as a good product is forcibly deteriorated by arbitrary cycling conditions.

The reference full-cell profile (R[k]) may represent the correspondence between the voltage and capacity of the reference cell over at least the voltage range of interest (e.g., 3.0 to 4.0V). The lower and upper limits of the voltage range of interest may be the first set voltage (3.0V in FIG. 12) and the second set voltage (4.0V in FIG. 12).

If the full-cell voltage of any battery cell, including the reference cell, is equal to the first set voltage, SOC may be set to 0%. When the full-cell voltage of any battery cell, including the reference cell, is equal to the second set voltage, SOC may be set to 100%. According to FIG. 12, the reference cell may reach a full charge state (SOC 100%) from a full discharge state (SOC 0%) by a charging capacity of 45 Ah.

In this specification, the positive electrode participation start point on the positive electrode profile of any battery cell represents the positive electrode voltage and the positive electrode capacity (or positive electrode SOC) when the full-cell voltage of the corresponding battery cell matches the first set voltage. Also, the negative electrode participation start point on the negative electrode profile of the corresponding battery cell indicates the negative electrode voltage and the negative electrode capacity (or negative electrode SOC) when the full-cell voltage of the corresponding battery cell matches the first set voltage. Therefore, the voltage difference between the positive electrode participation start point and the negative electrode participation start point may be equal to the first set voltage.

In addition, the positive electrode participation end point on the positive electrode profile of any battery cell indicates the positive electrode voltage and the positive electrode capacity (or positive electrode SOC) when the full-cell voltage of the corresponding battery cell matches the second set voltage. Also, the negative electrode participation end point on the negative electrode profile of the corresponding battery cell indicates the negative electrode voltage and the negative electrode capacity (or negative electrode SOC) when the full-cell voltage of the corresponding battery cell matches the second set voltage. Therefore, the voltage difference between the positive electrode participation end point and the negative electrode participation end point may be equal to the second set voltage.

In this specification, at least one of the positive electrode participation start point and the positive electrode participation end point may be simply referred to as a positive electrode point, and at least one of the negative electrode participation start point and the negative electrode participation end point may be simply referred to as a negative electrode point. Also, the positive electrode capacity (capacity value) at a specific point on the positive electrode profile of a certain battery cell may mean the capacity difference between any one of both end points of the positive electrode profile and the specific point. The positive electrode SOC at a specific point on the positive electrode profile of an arbitrary battery cell may mean the ratio of the capacity difference between any one of both end points (e.g., low capacity point) of the positive electrode profile and the specific point to the capacity difference between two end points of the positive electrode profile. The capacity difference between both end points of the positive electrode profile may be referred to as a total positive electrode capacity.

Likewise, the negative electrode capacity (capacity value) at a specific point on the negative electrode profile of any battery cell may mean the capacity difference between any one of both end points of the negative electrode profile (or positive electrode profile) and the specific point. The negative electrode SOC at a specific point on the negative electrode profile of any battery cell may mean the ratio of the capacity difference between any one of both end points (e.g., low capacity point) of the negative electrode profile (or positive electrode profile) and the specific point to the capacity difference between both end points of the negative electrode profile. The capacity difference between both end points of the negative electrode profile may be referred to as a total negative electrode capacity.

In the memory unit 330, the information indicating the voltage at each of the reference positive electrode participation start point (pi0), the reference positive electrode participation end point (pf0), the reference negative electrode participation start point (ni0), and the reference negative electrode participation end point (nf0) may be recorded in advance. The reference positive electrode participation start point (pi0) and the reference positive electrode participation end point (pf0) are the positive electrode participation start point and the positive electrode participation end point on the reference positive electrode profile (Rp[i]), respectively. The reference negative electrode participation start point (ni0) and the reference negative electrode participation end point (nf0) are the negative electrode participation start point and the negative electrode participation end point on the reference negative electrode profile (Rn[j]), respectively.

The voltage difference between the reference positive electrode participation start point (pi0) and the reference negative electrode participation start point (ni0) may be equal to the first set voltage (e.g., 3.0V). The voltage difference between the reference positive electrode participation end point (pf0) and the reference negative electrode participation end point (nf0) may be equal to the second set voltage (e.g., 4.0V).

Figure 13:
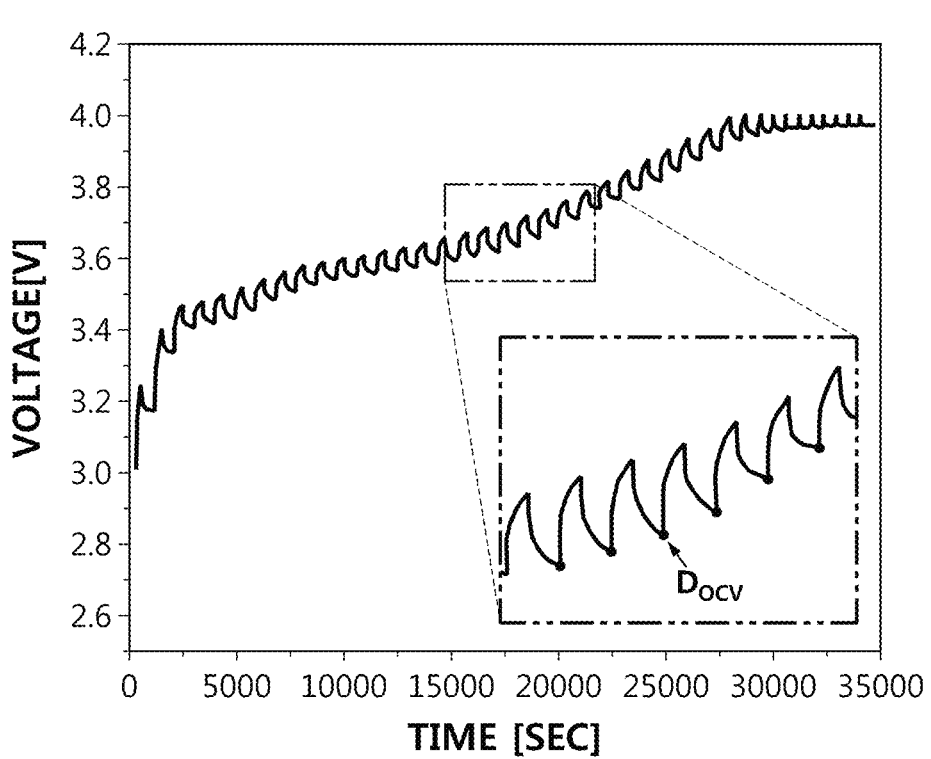
FIGS. 13 and 14 are graphs referenced to exemplarily describe a measurement full-cell profile.
Figure 14:
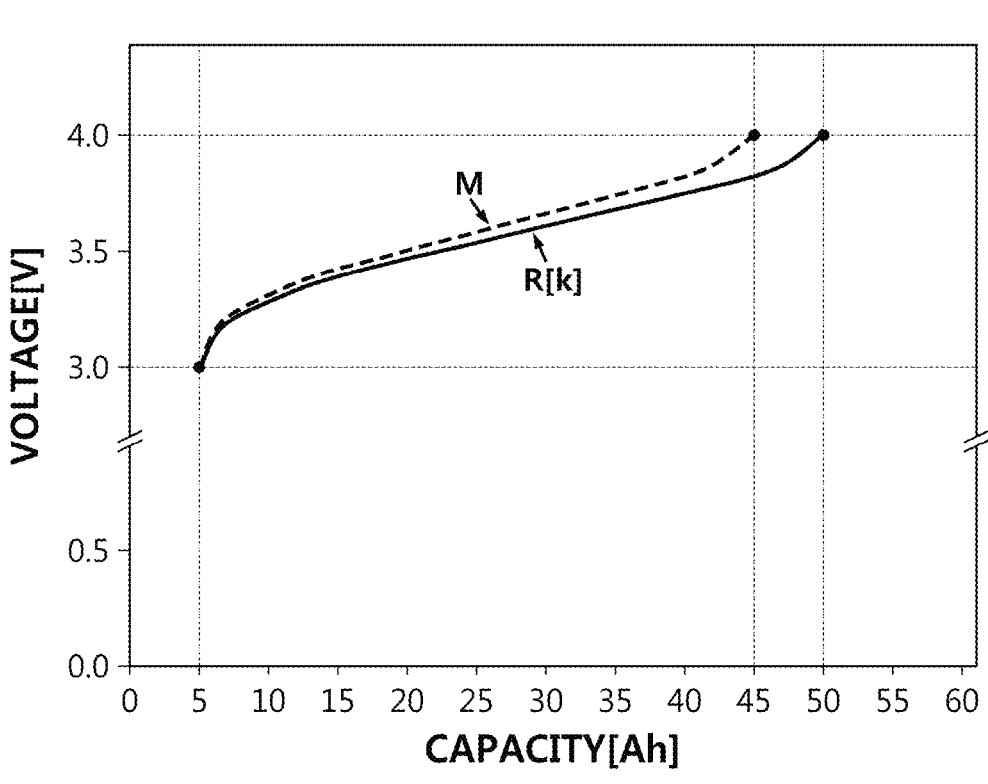

FIGS. 13 and 14 are graphs referenced to exemplarily describe the process of obtaining a measurement full-cell profile.

The graph depicted in FIG. 13 shows an example of the change in full-cell voltage of the target cell over time due to intermittent application of the second electric stimulation.

The target cell is a battery cell that is subject to diagnosis by the battery diagnosing apparatus. The target cell may be a new battery cell that requires verification as to whether it is a good product, or a battery cell that is no longer a new product due to deterioration after being verified as a good product.

Referring to FIG. 13, the processor 320 may control the stimulation applying device 301 to intermittently apply the second electric stimulation to the target cell BC.

The procedure for controlling the stimulation applying device 301 to diagnose the target cell BC may be carried out during the state change period until the electric state (e.g., full-cell voltage) of the target cell BC changes from the initial state (e.g., first set voltage) to the target state (e.g., second set voltage).

Referring to the graph in FIG. 13, the full-cell voltage of the target cell BC has a rising trend while repeating a sawtooth-shaped form. Each sawtooth-shaped voltage rise segment is caused by the application of the second electric stimulation, and the voltage drop segment is caused by the interruption of the second electric stimulation. That is, each voltage drop segment represents the change in full-cell voltage of the target cell BC over each rest period within the state change period. During each rest period, the target cell BC is placed in a no-load state without charging or discharging.

During the state change period, the processor 320 may repeatedly record current measurement values of the target cell BC to generate current measurement information. The capacity of the target cell BC is based on ampere counting of the current measurement values and, so the current measurement information may refer to capacity measurement information.

The processor 320 may control the stimulation applying device 301 to initiate a rest period of the second electric stimulation whenever a predetermined rest condition is satisfied within the state change period. In other words, the procedure of applying the second electric stimulation may be temporarily stopped when the rest condition is satisfied. For example, at least one of (i) the current integration value changes by a threshold integration value, (ii) the SOC changes by a threshold SOC, and (iii) the time for which the application of the second electric stimulation is maintained reaches a threshold time may be preset as a rest condition. For example, if the total current integration value during the state change period is 40 Ah and the threshold integration value is 2 Ah, a total of 20 rest periods may be granted in the state change period.

The processor 320 may determine at least one of the threshold integration value, the threshold SOC, and the threshold time based on the full charge capacity of the target cell BC, the SOH, or the previous diagnosis result. At least one of the threshold integration value, the threshold SOC, and the threshold time may have a predetermined positive (or negative) correspondence with the full charge capacity, the SOH, or the previous diagnosis result, and the relationship data (data table for controlling the rest period) in which this correspondence is defined may be stored in advance in the memory unit 330. Due to the predetermined positive (or negative) correspondence, as the full charge capacity, the SOH, or the previous diagnosis result decreases, at least one of the threshold integration value, the threshold SOC, and the threshold time also decreases. As a result, as the target cell BC deteriorates over time, rest periods are given at short time intervals within the state change period, so it is possible to prevent the number of data points included in the voltage measurement information, which indicates the change history of the full-cell voltage over time during the rest periods of the state change period, from being reduced.

The processor 320 may obtain at least one of the threshold integration value, the threshold SOC, and the threshold time mapped to the full charge capacity, the SOH, or the previous diagnosis result from the data table for rest period control. The processor 320 may control the intermittent application procedure of the second electric stimulation over the state change period using at least one of the threshold integration value, the threshold SOC, and the threshold time obtained from the data table for rest period control.

The processor 320 may control the stimulation applying device 301 to resume application of the second electric stimulation when the reference time passes from the start time point of the rest period of the second electric stimulation. The reference time may be predetermined so that the polarization caused by the second electric stimulation may be sufficiently resolved. For example, the reference time, which is the length of time of the rest period, may be the time required for the polarization at the start time point of the rest period to become 10% or less.

In each rest period of the second electric stimulation, the full-cell voltage of the target cell BC is measured at least once. As an example, the processor 320 may record the measurement value of the full-cell voltage at the end time point of each rest period of the second electric stimulation as the OCV of the target cell BC. As another example, the full-cell voltage may be measured at least three times in each rest period of the second electric stimulation, and the processor 320 may estimate the OCV of the target cell BC for each rest period based on the three full-cell voltage measurement values for each rest period.

Accordingly, the voltage measurement information may be generated by recording the OCV multiple times with time differences during the state change period. Each OCV point ($D_{OCV}$) marked in FIG. 13 is an example of a data point representing the OCV measurement value of the voltage measurement information.

The inventors of the present disclosure have recognized through multiple experiments that the voltage measurement information generated in the above manner using the second electric stimulation has high consistency with the voltage measurement information generated when actually applying the first electric stimulation to the target cell BC.

From now on, the advantages of a diagnostic method based on intermittent application of the second electric stimulation instead of continuous application of the first electric stimulation will be described.

It is assumes that the conditions related to the diagnosis of the target cell BC are as follows.

(i) First electric stimulation=charging at 0.05 C (ii) Second electric stimulation=charging at 3.0 C (iii) Length of the rest period of the second electric stimulation=12 minutes (iv) Total capacity change during the state change period=80% of the full charge capacity (FCC) of the target cell BC.

(v) Threshold integration value=3% of the full charge capacity of the target cell BC Then, the time taken for the target cell BC to change from the initial state to the target state by continuously applying the first electric stimulation is 1/0.05*80%=16 hours.

In comparison, the time taken for the charging capacity of the target cell BC to increase by the threshold integration value by the second electric stimulation is 0.03/3*80%=0.008 hours. Also, since a rest period is granted whenever the charging capacity increases by 3%, a total of 26 rest periods are granted during the state change period. Therefore, the time taken for the target cell BC to change from the initial state to the target state by intermittent application of the second electric stimulation is (0.008 hours+0.2 hours)*26=5.4 hours.

In other words, compared to the method of continuously applying the first electric stimulation, the method of intermittently applying the second electric stimulation is advantageous in shortening the time for obtaining the full-cell profile.

In the graph of FIG. 14, the horizontal axis (X-axis) represents capacity (Ah) and the vertical axis (Y-axis) represents voltage.

Referring to FIG. 14, the processor 320 may generate a measurement full-cell profile M representing the correspondence between capacity and voltage (also referred to as 'full-cell voltage') of the target cell BC, based on the capacity measurement information and the voltage measurement information of the target cell BC. The measurement full-cell profile M may also be referred to as a Q-V profile or a Q-OCV profile. The measurement full-cell profile M may be used as the 'first profile' in the claims.

Here, the full-cell voltage is the voltage across both ends of the target cell BC, and is distinguished from the positive electrode voltage and the negative electrode voltage described above. In other words, the full-cell voltage of the target cell BC may be regarded as the difference between the positive electrode voltage and the negative electrode voltage of the target cell BC.

To generate the measurement full-cell profile M, the current measurement information and the voltage measurement information mapped to the state change period may be used.

In detail, each data point of the current measurement information and the voltage measurement information is indexed in time order. Accordingly, the processor 320 may generate capacity measurement information by sequentially integrating data points of the current measurement information. In addition, the processor 320 may generate a measurement full-cell profile M by applying a curve fitting algorithm to a set of multiple Q-OCV pairs included in the capacity-voltage measurement information, which is a data set to which the capacity measurement information and the voltage measurement information are mapped. The reference full-cell profile (R[k]), the reference positive electrode profile (Rp[i]), the reference negative electrode profile (Rn[j]), and the measurement full-cell profile M may be polygonal equations where the order of the highest term is predetermined.

Like the reference full-cell profile (R[k]), the measurement full-cell profile M may represent the correspondence between the capacity of the target cell BC over at least the voltage range of interest (e.g., 3.0 to 4.0V) and the full-cell voltage (e.g., OCV).

As shown in FIG. 14, there is a certain degree of difference between the measurement full-cell profile M and the reference full-cell profile (R[k]). If the reference full-cell profile (R[k]) is appropriately adjusted, the difference from the measurement full-cell profile M may be reduced.

Meanwhile, in the graphs of FIGS. 12 and 14, Ah is used as the unit on the horizontal axis, but this unit may be expressed in other forms. For example, the unit on the horizontal axis may be percentage %, which represents SOC (State Of Charge), instead of Ah.

The processor 320 may generate a plurality of comparison profiles based on the plurality of electrode profiles included in the electrode profile map. In detail, the processor 320 may generate a plurality of comparison profiles by performing an adjustment procedure (also referred to as a 'profile adjustment logic') for each of the plurality of electrode profiles included in the electrode profile map according to a plurality of adjustment levels.

The profile adjustment logic may include at least one of a scaling operation and a shifting operation. When executing the profile adjustment logic, the processor 320 may generate a plurality of comparison profiles by repeating the adjustment procedure and synthesis procedure for each of the two electrode profiles (Rp[i], Rn[j]) of the $k^{th}$ electrode profile pair according to the plurality of adjustment levels. The comparison profile may also be referred to as a 'comparison full-cell profile'. Here, each comparison profile generated from the $k^{th}$ electrode profile pair may be a full-cell profile in which two adjusted electrode profiles as the result of adjustment for each of the reference positive electrode profile (Rp[i]) and the reference negative electrode profile (Rn[j]) are synthesized (combined). In other words, when the reference full-cell profile (R[k]) is the result of subtracting a part of the reference negative electrode profile (Rn[j]) from a part of the reference positive electrode profile (Rp[i]), the comparison profile may be regarded as the result of subtracting a part of the adjusted negative electrode profile from a part of the adjusted positive electrode profile. Each comparison profile may be referred to as an 'adjusted reference full-cell profile'.

The processor 320 may be configured to generate $k^{th}$ profile adjustment data by comparing each of the plurality of comparison profiles generated from the $k^{th}$ electrode profile pair with the measurement full-cell profile M.

The processor 320 may select any one comparison profile with a minimum comparison value with the measurement full-cell profile M among the plurality of comparison profiles generated from the $k^{th}$ electrode profile pair (Rp[i], Rn[j]). The processor 320 may determine the comparison value of each of the plurality of comparison profiles for the measurement full-cell profile M, and determine the $k^{th}$ comparison value to be equal to the minimum value among the plurality of comparison values.

In relation to this, various methods known at the filing time of this application may be employed to determine a comparison value between two profiles. For example, the integral value of the absolute value for the area between two profiles, a MSE (Mean Square Error), or a RMSE (Root Mean Square Error) may be used as a comparison value.

The processor 320 may generate $k^{th}$ profile adjustment data related to the $k^{th}$ electrode profile pair (Rp[i], Rn[j]). The $k^{th}$ profile adjustment data may include information representing at least one of a $k^{th}$ comparison value, a $k^{th}$ representative profile, a $k^{th}$ adjusted positive electrode profile, and a $k^{th}$ adjusted negative electrode profile. The $k^{th}$ representative profile is a comparison profile mapped to the minimum comparison value among the plurality of comparison profiles generated from the $k^{th}$ electrode profile pair (Rp[i], Rn[j]).

The $k^{th}$ adjusted positive electrode profile and the $k^{th}$ adjusted negative electrode profile are two adjusted electrode profiles used synthesizing the $k^{th}$ representative profile. The information representing the $k^{th}$ adjusted positive electrode profile includes the $k^{th}$ adjusted positive electrode profile itself and/or at least one diagnostic factor that may be confirmed from the $k^{th}$ adjusted positive electrode profile. The information representing the $k^{th}$ adjusted negative electrode profile includes the $k^{th}$ adjusted negative electrode profile itself and/or at least one diagnostic factor that may be confirmed from the $k^{th}$ adjusted negative electrode profile.

When each natural number from 1 to m×n is set to k and the above-described procedure is performed a total of m×n times, first to m×n$^{th}$ profile adjustment data are generated. Any one of the first to m×n$^{th}$ profile adjustment data may be selected by the processor 320 as information that most closely represents the current charging and discharging performance (current degradation state) of the target cell BC. If the k$^{th}$ comparison value among the first to m×n$^{th}$ comparison values is the minimum, the k$^{th}$ representative profile among the first to m×n$^{th}$ representative profiles may be used as the 'second profile' in the claims.

According to this configuration of the present disclosure, the information about the positive electrode profile and the negative electrode profile of the target cell BC may be individually estimated precisely even if the target cell BC is not disassembled or manufactured in the form of a 3-electrode battery.

If the target cell BC is a new battery cell, the adjusted positive electrode profile and the adjusted negative electrode profile may be analyzed and utilized more easily to diagnose whether a defect occurs in the target cell BC and, if so, what type of defect it is.

If a battery cell is used after the target cell BC is verified to be a good product, it is possible to determine how much the target cell BC is deteriorated for each diagnostic item indicating the degradation state through the adjusted positive electrode profile and the adjusted negative electrode profile.

Hereinafter, with reference to FIGS. 15 to 20, the profile adjustment logic implemented to estimate one of parameters (diagnostic factors) involved in the current charging and discharging performance of the target cell BC will be described.

Figure 15:
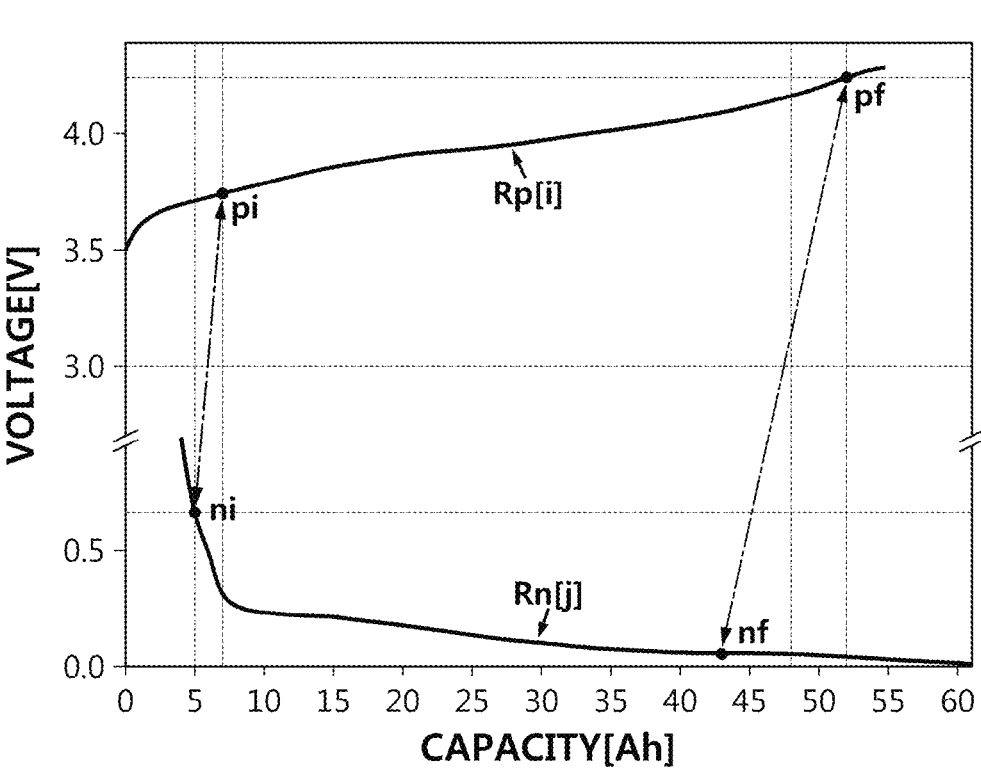
FIGS. 15 to 17 are diagrams referenced to describe an example of a procedure of generating profile adjustment result information using a profile adjustment logic.
Figure 16:
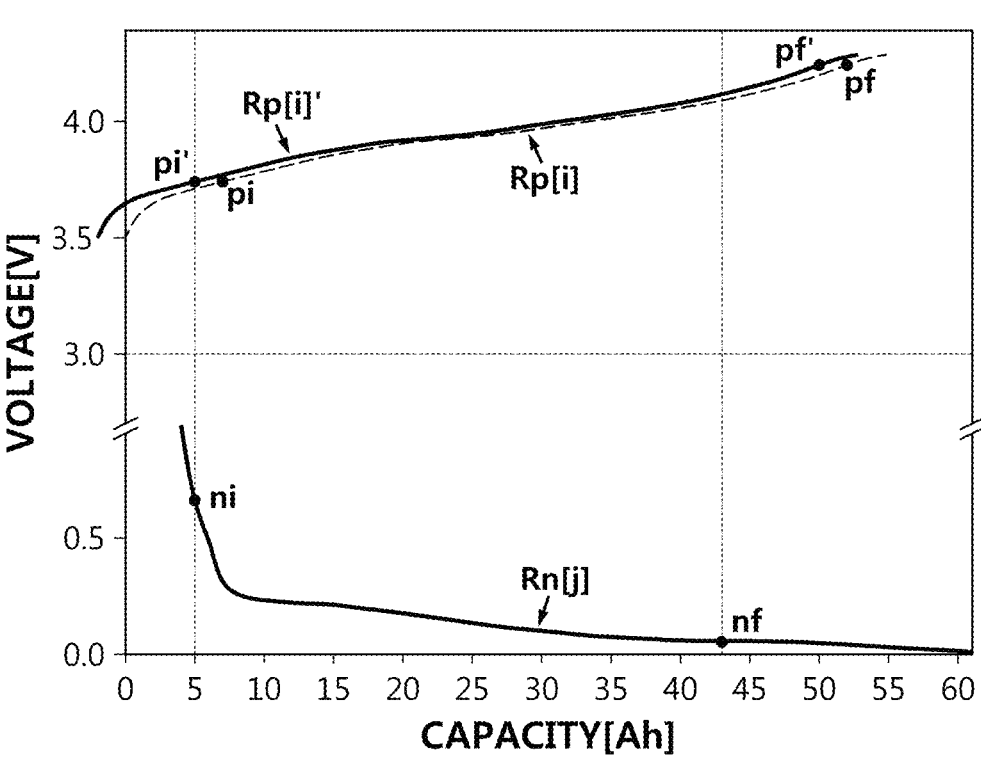
Figure 17:
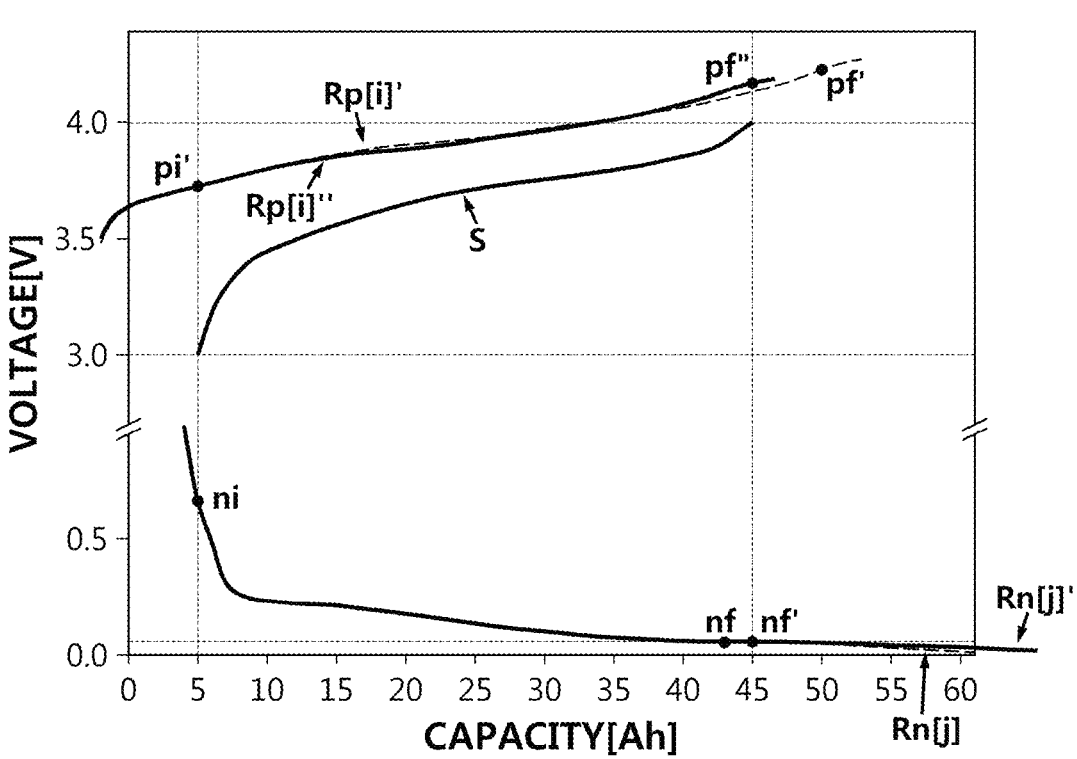

FIGS. 15 to 17 are diagrams referenced to describe an example of a procedure of generating a comparison profile used for comparison with the measurement full-cell profile M from the k$^{th}$ electrode profile pair (Rp[i], Rn[j]).

The profile adjustment logic, which will be explained with reference to FIGS. 15 to 17, proceeds in the order of a first routine for setting four points (positive electrode participation start point, positive electrode participation end point, negative electrode participation start point, negative electrode participation end point) to correspond to the voltage range of interest (see FIG. 15), a second routine for performing the shifting operation (see FIG. 16), and a third routine for performing the scaling operation (see FIG. 17). That is, the profile adjustment logic according to an embodiment of the present disclosure includes the first to third routines.

First, referring to FIG. 15, the reference positive electrode profile (Rp[i]) and the reference negative electrode profile (Rn[j]) are the same as those shown in FIG. 12.

The processor 320 determines the positive electrode participation start point (pi), the positive electrode participation end point (pf), the negative electrode participation start point (ni) and the negative electrode participation end point (nf) on the reference positive electrode profile (Rp[i]) and the reference negative electrode profile (Rn[j]).

Either the positive electrode participation start point (pi) or the negative electrode participation start point (ni) depends on the other. As an example, the processor 320 may divide the positive electrode voltage range from the start point to the end point (or, second set voltage), which are both end points of the reference positive electrode profile (Rp[i]), into a plurality of small voltage sections, and then set a boundary point of two adjacent small voltage sections among the plurality of small voltage sections as a positive electrode participation start point (pi). Each small voltage section may have a predetermined size (e.g., 0.01V). Next, the processor 320 may set a point on the reference negative electrode profile (Rn[j]) that is smaller than the positive electrode participation start point (pi) by the first set voltage (e.g., 3V) as a negative electrode participation start point (ni). As another example, the processor 320 may divide the negative electrode voltage range from the start point to the end point of the reference negative electrode profile (Rn[j]) into a plurality of small voltage sections of a predetermined size, and then set a boundary point of two adjacent small voltage sections among the plurality of small voltage sections as a negative electrode participation start point (ni). Next, the processor 320 may search for a point greater than the negative electrode participation start point (ni) by the first set voltage from the reference positive electrode profile (Rp[i]) and set the searched point as a positive electrode participation start point (pi).

Either the positive electrode participation end point (pf) or the negative electrode participation end point (nf) depends on the other. As an example, the processor 320 may divide the voltage range from the second set voltage to the end point of the reference positive electrode profile (Rp[i]) into a plurality of small voltage sections of a predetermined size, and then set a boundary point two adjacent small voltage section among the plurality of small voltage sections as a positive electrode participation end point (pf). Next, the processor 320 may set a point on the reference negative electrode profile (Rn[j]) that is smaller than the positive electrode participation end point (pf) by the second set voltage (e.g., 4V) as a negative electrode participation end point (nf). As another example, the processor 320 may divide the negative electrode voltage range from the start point to the end point of the reference negative electrode profile (Rn[j]) into plurality of small voltage sections of a predetermined size, and then set a boundary point between two adjacent small voltage sections among the plurality of small voltage sections as a negative electrode participation end point (nf). Next, the processor 320 may search for a point that is greater than the negative electrode participation end point (nf) by the second set voltage from the reference positive electrode profile (Rp[i]) and set the searched point as a positive electrode participation end point (pf).

If the positive electrode participation start point (pi), the positive electrode participation end point (pf), the negative electrode participation start point (ni), and the negative electrode participation end point (nf) are completely determined, the processor 320 shifts at least one of the reference positive electrode profile (Rp[i]) and the reference negative electrode profile (Rn[j]) to the left or right along the horizontal axis.

Referring to FIG. 16, the processor 320 may shift the reference positive electrode profile (Rp[i]) to the left (toward low capacity) or shift the reference negative electrode profile (Rn[j]) to the right (toward high capacity), or shift both of them, so that the capacity values of the positive electrode participation start point (pi) and the negative electrode participation start point (ni) on the horizontal axis match.

Alternatively, the processor 320 shifts the reference positive electrode profile (Rp[i]) to the left or shift the reference negative electrode profile (Rn[j]) to the right, or shift both of them, so that the capacity values of the positive electrode participation end point (pf) and the negative electrode participation end point (nf) on the horizontal axis match.

Compared to FIG. 15, FIG. 16 illustrates a situation where only the reference positive electrode profile (Rp[i]) is shifted to the left to generate an adjusted positive electrode profile (Rp[i]'), and as a result, the capacity value of the positive electrode participation start point (pi') matches the capacity value of the negative electrode participation start point (ni). The adjusted positive electrode profile (Rp[i]') is the result of applying an adjustment procedure that shifts to the left by the voltage difference between the positive electrode participation start point (pi) and the negative electrode participation start point (ni) to the reference positive electrode profile (Rp[i]). Therefore, the two points (pi, pi') are different only in capacity value and have the same voltage. The two points (pf, pf') are also different only in the capacity value and have the same voltage.

If the adjustment result profiles (Rp[i]', Rn) in which at least one of the reference positive electrode profile (Rp[i]) and the reference negative electrode profile (Rn[j]) is shifted are secured, the processor 320 scales the capacity range of at least one of the adjustment result profiles (Rp[i]', Rn).

According to the example shown in FIG. 16, the processor 320 performs an additional adjustment procedure to shrink or expand at least one of the adjusted positive electrode profile (Rp[i]') and the reference negative electrode profile (Rn[j]) along the horizontal axis.

Referring to FIG. 17, the processor 320 may generate an adjusted positive electrode profile (Rp[i]") by shrinking or expanding the adjusted positive electrode profile (Rp[i]') so that the size of the capacity range between two points (pi', pf') of the adjusted positive electrode profile (Rp[i]') matches the size of the capacity range of the measurement full-cell profile M. At this time, any one point (pi') of the two points (pi', pf') may be fixed. Accordingly, the capacity difference between the two points (pi', pf") of the adjusted positive electrode profile (Rp[i]") may match the capacity range of the measurement full-cell profile M.

In addition, the processor 320 may generate an adjusted negative electrode profile (Rn[j]') by shrinking or expanding the reference negative electrode profile (Rn[j]) so that the size of the capacity range between two points (ni, nf) of the reference positive electrode profile (Rn[j]) matches the size of the capacity range of the measurement full-cell profile M. At this time, any one point (ni) of the two points (ni, nf) may be fixed. Accordingly, the capacity difference between the two points (ni, nf') of the adjusted negative electrode profile (Rn[j]') may match the capacity range of the measurement full-cell profile M.

In FIG. 17, the adjusted positive electrode profile (Rp[i]") is the result of shrinking the adjusted positive electrode profile (Rp[i]') shown in FIG. 16, and the adjusted negative electrode profile (Rn[j]') is the result of expanding the reference negative electrode profile (Rn[j]) shown in FIG. 14.

The positive electrode participation end point (pf") on the adjusted positive electrode profile (Rp[i]") corresponds to the positive electrode participation end point (pf) on the adjusted positive electrode profile (Rp[i]'). The negative electrode participation end point (nf') on the adjusted negative electrode profile (Rn[j]') corresponds to the negative electrode participation end point (nf) on the reference negative electrode profile (Rn[j]).

The capacity difference between the positive electrode participation start point (pi') and the positive electrode participation end point (pf") of the adjusted positive electrode profile (Rp[i]") corresponds to the size of the capacity range of the measured full-cell profile M. Likewise, the capacity difference between the negative electrode participation start point (ni) and the negative electrode participation end point (nf') of the adjusted negative electrode profile (Rn[j]') corresponds to the size of the capacity range of the measured full-cell profile M.

In addition, the capacity range by the two points (pi', pf") of the adjusted positive electrode profile (Rp[i]") matches the capacity range by the two points (ni, nf') of the adjusted negative electrode profile (Rn[j]').

The processor 320 may generate a comparison profile S using the adjusted positive electrode profile (Rp[i]") and the adjusted negative electrode profile (Rn[j]'). The processor 320 may generate a comparison profile S based on the voltage difference data between the adjusted positive electrode profile (Rp[i]") and the adjusted negative electrode profile (Rn[j]'). The voltage difference data may represent the capacity-voltage difference relationship in the common capacity range of the two profiles (Rp[i]", Rn[j]'). In other words, the processor 320 may generate a comparison profile S by subtracting the profile between two points (pi, pf') of the adjusted positive electrode profile (Rp[i]") from the profile between two points (ni, nf') of the adjusted negative electrode profile (Rn[j]').

The processor 320 may calculate the comparison value between the comparison profile S and the measurement full-cell profile M.

The processor 320 may map at least two of the adjusted positive electrode profile (Rp[i]"), the adjusted negative electrode profile (Rn[j]'), the positive electrode participation start point (pi'), the positive electrode participation end point (pf"), the negative electrode participation start point (ni), the negative electrode participation end point (nf'), the positive electrode scale factor, the negative electrode scale factor, the comparison profile S, and the comparison value with each other and record the same in the memory unit 330.

The positive electrode scale factor may represent the ratio of the capacity difference between both ends of the adjusted positive electrode profile (Rp[i]") to the capacity difference between both ends of the reference positive electrode profile (Rp[i]). The positive electrode scale factor may represent the ratio of the capacity difference between two points (pi', pf") to the capacity difference between two points (pi0, pf0). Alternatively, the positive electrode scale factor may represent the ratio of the positive electrode capacity difference between two points (pi', pf") to the positive electrode capacity difference between two points (pi0, pf0). Alternatively, the positive electrode scale factor may represent the ratio of the positive electrode SOC difference between two points (pi', pf") to the positive electrode SOC difference between two points (pi0, pf0).

The negative electrode scale factor may represent the ratio of the capacity difference between both ends of the adjusted negative electrode profile (Rn[j]') to the capacity difference between both ends of the reference negative electrode profile (Rn[j]). Alternatively, the negative electrode scale factor may represent the ratio of the capacity difference between two points (ni, nf') to the capacity difference between two points (ni0, nf0). Alternatively, the negative electrode scale factor may represent the ratio of the negative electrode capacity difference between two points (ni, nf") to the negative electrode capacity difference between two points (ni0, nf0). Alternatively, the negative electrode scale factor may represent the ratio of the negative electrode SOC difference between two points (ni, nf') to the negative electrode SOC difference between two points (ni0, nf0).

Meanwhile, as described above, when the positive electrode voltage range of the reference positive electrode profile (Rp[i]) is divided into a plurality of small voltage sections, the boundary point of two adjacent small voltage sections among the plurality of small voltage sections may be set as a positive electrode participation start point (pi).

For example, if the positive electrode voltage range of the reference positive electrode profile (Rp[i]) is divided into 100 small voltage ranges, there may be 100 boundary points that can be set as the positive electrode participation start point (pi). Also, if the voltage range greater than or equal to the second set voltage in the reference positive electrode profile (Rp[i]) is divided into 40 small voltage ranges, there may be 40 boundary points that can be set as the positive electrode participation end point (pf). In this case, at least 4,000 different comparison profiles may be generated from the $k^{th}$ electrode profile pair (Rp[i], Rn[j]).

Of course, it will be easily understood by those skilled in the art that as the size of the small voltage section decreases, the maximum number of comparison profiles that can be generated increases, and conversely, as the size of the small voltage section increases, the maximum number of comparison profiles that can be generated decreases.

The processor 320 may generate $k^{th}$ profile adjustment data associated with the $k^{th}$ representative profile having the minimum $k^{th}$ comparison value among the comparison values of the plurality of comparison profiles generated based on the $k^{th}$ electrode profile pair (Rp[i], Rn[j]) as described above. The $k^{th}$ profile adjustment data may be recorded in the memory unit 330.

Figure 18:
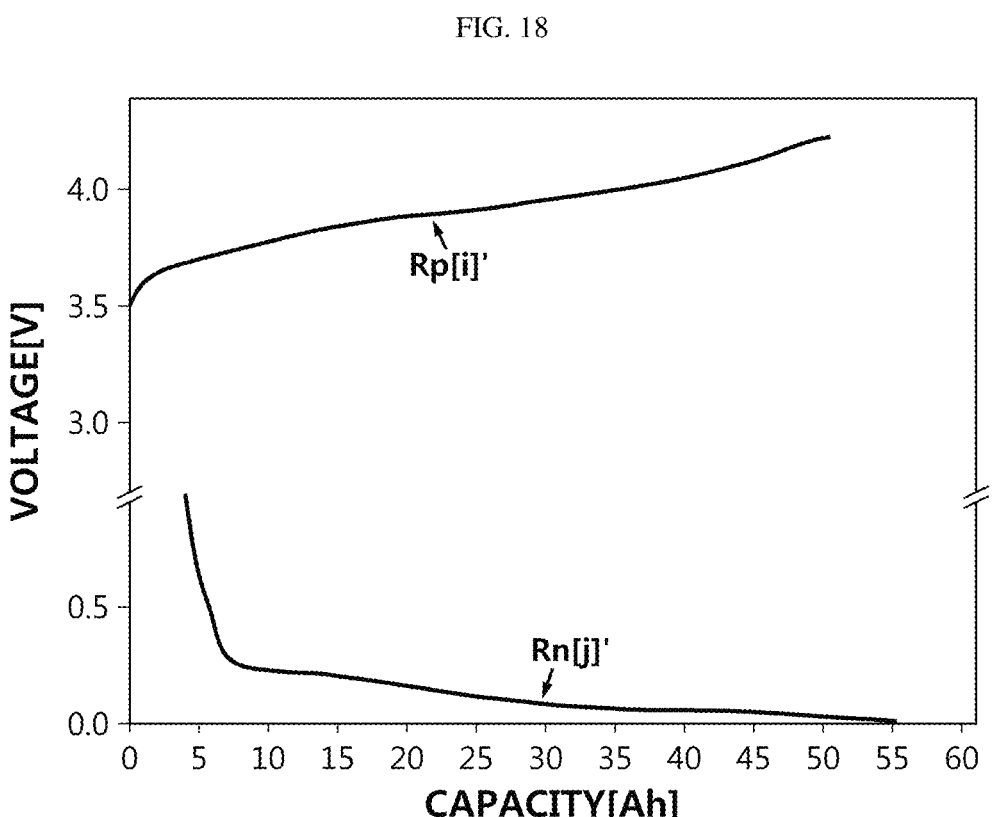
FIGS. 18 to 20 are diagrams referenced to describe another example of a procedure of generating profile adjustment result information using a profile adjustment logic.
Figure 19:
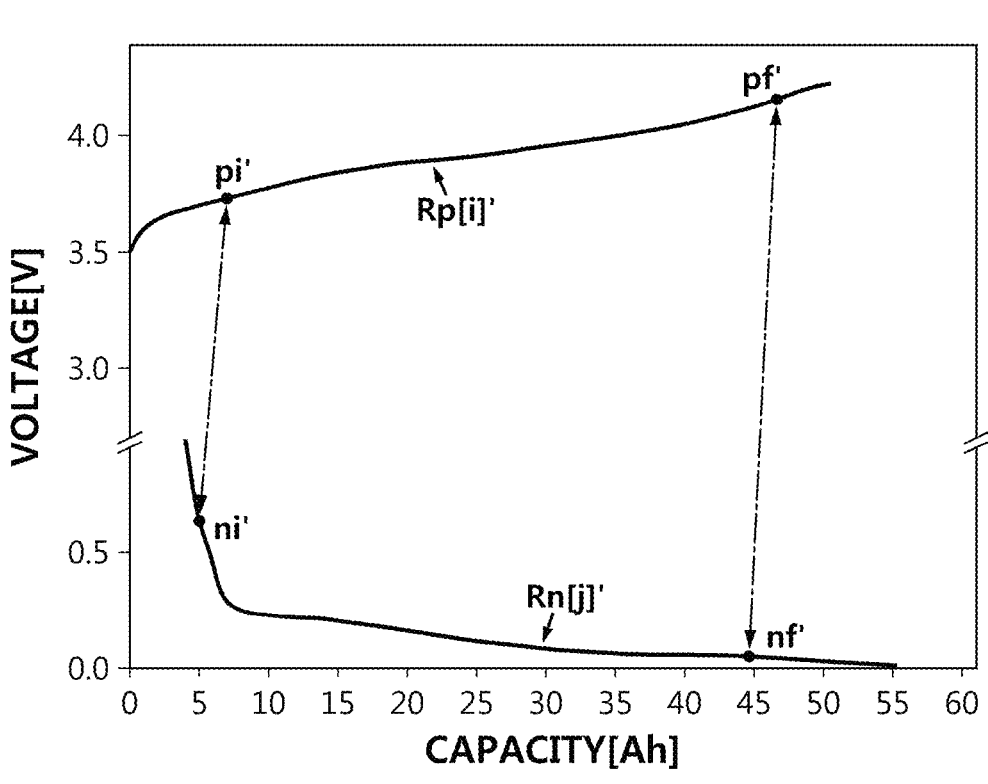
Figure 20:
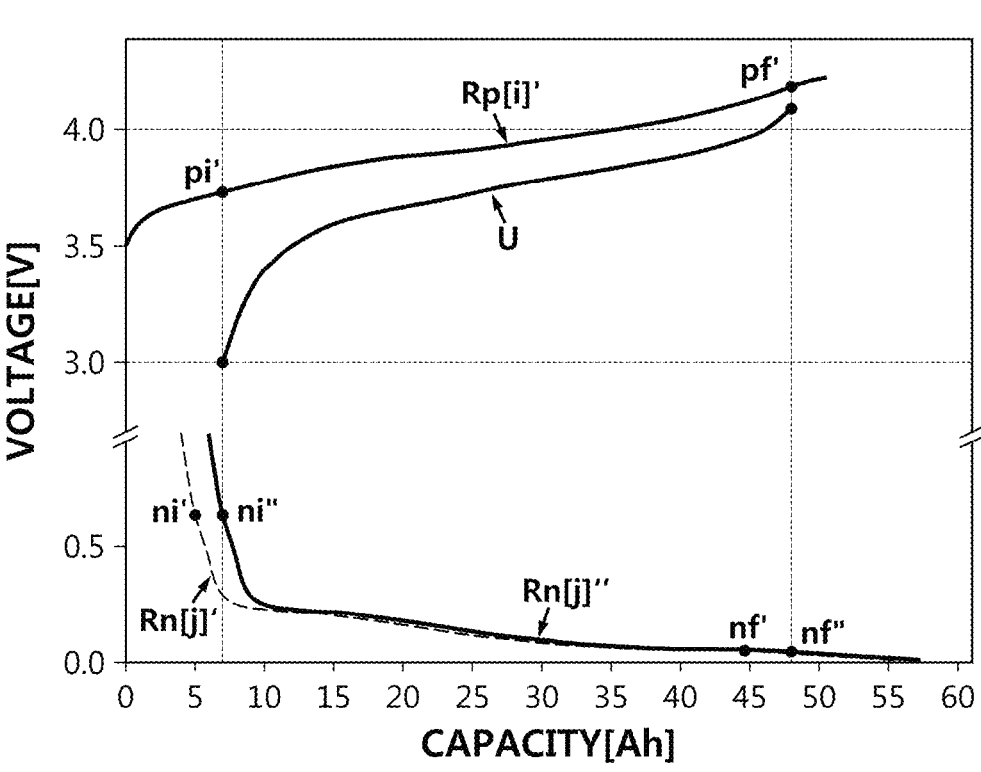

FIGS. 18 to 20 are diagrams referenced to describe another example of a procedure of generating a comparison profile used for comparison with the measurement full-cell profile M from the $k^{th}$ electrode profile pair (Rp[i], Rn[j]). For reference, the embodiment shown in FIGS. 18 to 20 is independent from the embodiment shown in FIGS. 15 to 17. Accordingly, terms or reference signs commonly used to describe the embodiment shown in FIGS. 15 to 17 and the embodiment shown in FIGS. 18 to 20 should be understood as being limited to each embodiment.

Another example of the profile adjustment logic to be explained with reference to FIGS. 18 to 20 proceeds in the order of a fourth routine (see FIG. 18) that performs the scaling operation, a fifth routine (see FIG. 19) that sets four points (positive electrode participation start point, positive electrode participation end point, negative electrode participation start point, and negative electrode participation end point), and a sixth routine (see FIG. 20) that performs the shifting operation. That is, the profile adjustment logic according to another embodiment of the present disclosure includes the fourth to sixth routines.

Referring to FIG. 18, the processor 320 generates an adjusted positive electrode profile (Rp[i]') and an adjusted negative electrode profile (Rn[j]') by applying the positive electrode scale factor and the negative electrode scale factor selected from the scaling value range to the reference positive electrode profile (Rp[i]) and the reference negative electrode profile (Rn[j]), respectively.

The scaling value range may be predetermined or may vary depending on the ratio of the size of the capacity range of the measurement full-cell profile M to the size of the capacity range of the reference full-cell profile (R[k]). As an example, assuming that the positive electrode scale factor and the negative electrode scale factor can be selected among the values (i.e., 90%, 90.1%, 90.2%, . . . 98.9%, 99%) spaced by 0.1% in the scaling value range (e.g., 90 to 99%), 91 values may be selected as the positive electrode scale factor and the negative electrode scale factor, respectively. In this case, according to 91×91=8,281 adjustment levels (combinations of the positive electrode scale factors and the negative electrode scale factors), a maximum of 8,281 adjusted profile pairs may be generated from the $k^{th}$ electrode profile pair (Rp[i], Rn[j]). The adjusted profile pair refers to a combination of an adjusted positive electrode profile and an adjusted negative electrode profile.

Referring to FIG. 18, the adjusted positive electrode profile (Rp[i]') and the adjusted negative electrode profile (Rn[j]') illustrate the result of applying the positive electrode scale factor and the negative electrode scale factor as one adjustment level among the plurality of adjustment levels, respectively, to the reference positive electrode profile (Rp[i]) and the reference negative electrode profile (Rn[j]).

When the positive electrode scale factor and the negative electrode scale factor are less than 100%, the adjusted positive electrode profile (Rp[i]') is obtained by shrinking the reference positive electrode profile (Rp[i]) along the horizontal axis, and the adjusted negative electrode profile (Rn[j]') is also obtained by shrinking the reference negative electrode profile (Rn[j]) along the horizontal axis. To facilitate understanding, the reference positive electrode profile (Rp[i]) and the reference negative electrode profile (Rn[j]) are shown in a form in which the start points of them are respectively fixed and the remaining parts are shrunken to the left along the horizontal axis.

Referring to FIG. 19, the processor 320 determines a positive electrode participation start point (pi'), a positive electrode participation end point (pf"), a negative electrode participation start point (ni'), and a negative electrode participation end point (nf') on the adjusted positive electrode profile (Rp[i]') and the adjusted negative electrode profile (Rp[i]').

Either the positive electrode participation start point (pi') or the negative electrode participation start point (ni') may depend on the other. Also, either the positive electrode participation end point (pf) or the negative electrode participation end point (nf) may depend on the other. Also, either the positive electrode participation start point (pi') or the positive electrode participation end point (pf') may be set based on the other.

That is, if any one of the positive electrode participation start point (pi'), the positive electrode participation end point (pf'), the negative electrode participation start point (ni'), and the negative electrode participation end point (nf') is set, the remaining three points may be automatically set by the first set voltage, the second set voltage, and/or the size of the capacity range of the measurement full-cell profile M (e.g., 45Ah-5Ah=40Ah in FIG. 14).

As an example, the processor 320 may divide the positive electrode voltage range from the start point to the end point (or, second set voltage) of the adjusted positive electrode profile (Rp[i]') into a plurality of small voltage sections, and then set a boundary point of two adjacent small voltage sections among the plurality of small voltage sections as the positive electrode participation start point (pi'). Next, the processor 320 may set a point on the adjusted negative electrode profile (Rn[j]) that is smaller than the positive electrode participation start point (pi') by the first set voltage (e.g., 3V) as the negative electrode participation start point (ni').

As another example, the processor 320 may divide the negative electrode voltage range from the start point to the end point of the adjusted negative electrode profile (Rn[j]') into a plurality of small voltage sections of a predetermined size, and then set a boundary point of two adjacent small voltage sections among the plurality of small voltage sections as the negative electrode participation start point (ni'). Next, the processor 320 may search for a point greater than the negative electrode participation start point (ni') by the first set voltage from the reference positive electrode profile (Rp[i]), and select the searched point as the positive electrode participation start point (pi').

As still another example, the processor 320 may divide the voltage range from the second set voltage to the end point of the adjusted positive electrode profile (Rp[i]') into a plurality of small voltage sections of a predetermined size, and then set a boundary point of two adjacent small voltage sections among the plurality of small voltage sections as the positive electrode participation end point (pf'). Next, the processor 320 may search for a point smaller than the positive electrode participation end point (pf") by the second set voltage (e.g., 4V) from the adjusted negative electrode profile (Rn[j]'), and set the searched point as the negative electrode participation end point (nf').

As still another example, the processor 320 may divide the negative electrode voltage range from the start point to the end point of the adjusted negative electrode profile (Rn[j]') into a plurality of small voltage section of a predetermined size, and then set a boundary point of two adjacent small voltage sections among the plurality of small voltage sections as the negative electrode participation end point (nf'). Next, the processor 320 may search for a point greater than the negative electrode participation end point (nf') by the second set voltage from the adjusted positive electrode profile (Rp[i]'), and set the searched point as the positive electrode participation end point (pf').

If any one of the positive electrode participation start point (pi'), the positive electrode participation end point (pf'), the negative electrode participation start point (ni'), and the negative electrode participation end point (nf') is determined, the processor 320 may additionally determine the remaining three points based on the determined point.

For example, if the positive electrode participation start point (pi') is determined first, the processor 320 may set a point on the adjusted positive electrode profile (Rp[i]') having a capacity value that is larger than the capacity value of the positive electrode participation start point (pi') by the size of the capacity range of the measurement full-cell profile M as the positive electrode participation end point (pf'). In addition, the processor 320 may search for a point lower than the positive electrode participation start point (pi') by the first set voltage from the adjusted negative electrode profile (Rn[j]'), and set the searched point as the negative electrode participation start point (ni'). In addition, the processor 320 may set a point on the adjusted negative electrode profile (Rn[j]') having a capacity value greater than the capacity value of the negative electrode participation start point (ni') by the size of the capacity range of the measurement full-cell profile M as the negative electrode participation end point (nf').

As another example, when the positive electrode participation end point (pf') is determined first, the processor 320 may set a point on the adjusted positive electrode profile (Rp[i]') having a capacity value smaller than the capacity value of the positive electrode participation end point (pf') by the size of the capacity range of the measurement full-cell profile M as the positive electrode participation start point (pi'). In addition, the processor 320 may search for a point lower than the positive electrode participation end point (pf') by the second set voltage from the adjusted negative electrode profile (Rn[j]'), and set the searched point as the negative electrode participation end point (nf'). In addition, the processor 320 may set a point on the adjusted negative electrode profile (Rn[j]') having a capacity value smaller than the capacity value of the negative electrode participation end point (nf') by the size of the capacity range of the measurement full-cell profile M as the negative electrode participation start point (ni').

As still another example, when the negative electrode participation start point (ni') is determined, the processor 320 may set a point on the adjusted negative electrode profile (Rn[j]') having a capacity value larger than the capacity value of the negative electrode participation start point (ni') by the size of the capacity range of the measurement full-cell profile M as the negative electrode participation end point (nf'). In addition, the processor 320 may search for a point higher than the negative electrode participation start point (ni') by the first set voltage from the adjusted positive electrode profile (Rp[i]'), and set the searched point as the positive electrode participation start point (pi'). In addition, the processor 320 may set a point on the adjusted positive electrode profile (Rp[i]') having a capacity value greater than the capacity value of the positive electrode participation start point (pi') by the size of the capacity range of the measurement full-cell profile M as the positive electrode participation end point (pf').

As still another example, when the negative electrode participation end point (nf') is determined, the processor 320 may set a point on the adjusted negative electrode profile (Rn[j]') having a capacity value smaller than the capacity value of the negative electrode participation end point (nf') by the size of the capacity range of the measurement full-cell profile M as the negative electrode participation start point (ni'). In addition, the processor 320 may search for a point higher than the negative electrode participation end point (nf') by the second set voltage from the adjusted positive electrode profile (Rp[i]'), and set the searched point as the positive electrode participation end point (pf'). In addition, the processor 320 may set a point on the adjusted positive electrode profile (Rp[i]') having a capacity value smaller than the capacity value of the positive electrode participation end point (pf') by the size of the capacity range of the measurement full-cell profile M as the positive electrode participation start point (pi').

If the positive electrode participation start point (pi'), the positive electrode participation end point (pf'), the negative electrode participation start point (ni') and the negative electrode participation end point (nf') are completely determined based on the pair of positive electrode scale factor and negative electrode scale factor, the processor 320 may shift at least one of the adjusted positive electrode profile (Rp[i]') and the adjusted negative electrode profile (Rn[j]') to the left or right along the horizontal axis so that the capacity values of the positive electrode participation start point (pi') and the negative electrode participation start point (ni') match or the capacity values of the positive electrode participation start point (pf") and the negative electrode participation start point (nf') match.

The adjusted negative electrode profile (Rn[j]") shown in FIG. 20 is obtained by shifting only the adjusted negative electrode profile (Rn[j]') shown in FIG. 19 to the right. Accordingly, the capacity values of the positive electrode participation start point (pi') and the negative electrode participation start point (ni") match each other on the horizontal axis. Relatedly, the capacity difference between the positive electrode participation start point (pi') and the positive electrode participation end point (pf') is equal to the capacity difference between the negative electrode participation start point (ni') and the negative electrode participation end point (nf'). Therefore, if the capacity values of the positive electrode participation start point (pi') and the negative electrode participation start point (ni") match each other, the capacity values of the positive electrode partici-pation end point (pf") and the negative electrode participa-tion end point (nf') also match each other on the horizontal axis.

Referring to FIG. 20, the processor 320 may generate a comparison profile U using the adjusted positive electrode profile (Rp[i]') and the adjusted negative electrode profile (Rn[j]"). The processor 320 may generate a comparison profile U based on voltage difference data between the adjusted positive electrode profile (Rp[i]') and the adjusted negative electrode profile (Rn[j]41. The voltage difference data may represent the capacity-voltage difference relation-ship in the common capacity range of the two profiles (Rp[i]', Rn[j]"). In other words, the processor 320 may generate a comparison profile U by subtracting the profile between two points (pi', pf") of the adjusted positive elec-trode profile (Rp[i]') from the profile between two points (ni", nf") of the adjusted negative electrode profile (Rn[j]"). The processor 320 may generate a comparison profile U by subtracting the profile between two points (pi', pf") of the adjusted positive electrode profile (Rp[i]') from the profile between two points (ni", nf") of the adjusted negative electrode profile (Rn[j]").

The processor 320 may calculate a comparison value between the comparison profile U and the measurement full-cell profile M.

The processor 320 may map at least two of the positive electrode profile (Rp[i]'), the adjusted negative electrode profile (Rn[j]"), the positive electrode participation start point (pi'), the positive electrode participation end point (pf'), the negative electrode participation start point (ni"), the negative electrode participation end point (nf"), the positive electrode scale factor, the negative electrode scale factor, the comparison profile U and the comparison value with each other and record the same in the memory unit 330.

As described above, the processor 320 may generate a comparison profile corresponding to each pair of the positive electrode scale factor and the negative electrode scale factor selected from the scaling value range. Since the pairs of positive electrode scale factor and negative electrode scale factor are plural, it is obvious that the comparison profile will also be generated in plural numbers.

The processor 320 may generate $k^{th}$ profile adjustment data associated with the $k^{th}$ representative profile having the minimum $k^{th}$ comparison value among the comparison val-ues of the plurality of comparison profiles generated based on the $k^{th}$ electrode profile pair (Rp[i], Rn[j]). The $k^{th}$ profile adjustment data may be recorded in the memory unit 330.

The processor 320 may obtain at least one diagnostic factor from any one profile adjustment data (associated with the second profile) mapped to the minimum comparison value among the first to $m×n^{th}$ profile adjustment data.

In detail, the profile adjustment data associated with the second profile includes at least one of the positive electrode state data and the negative electrode state data.

The positive electrode state data is based on the adjusted positive electrode profile, which is used to generate the second profile. As an example, when the comparison profile S shown in FIG. 17 is determined as the second profile, at least one of the positive electrode point (pi') of the adjusted positive electrode profile (Rp[i]"), the positive electrode point (pf"), the positive electrode scale factor and the positive electrode loading amount may be included in the positive electrode state data as a diagnostic factor. As another example, when the comparison profile U shown in FIG. 20 is determined as the second profile, at least one of the positive electrode point (pi') of the adjusted positive electrode profile (Rp[i]'), the positive electrode point (pf'), the positive electrode scale factor and the positive electrode loading amount may be included in the positive electrode state data as a diagnostic factor.

The negative electrode state data is based on the adjusted negative electrode profile, which is used to generate the second profile. As an example, when the comparison profile S shown in FIG. 17 is determined as the second profile, at least one of the negative electrode point (ni) of the adjusted negative electrode profile (Rn[i]'), the negative electrode point (nf'), the negative electrode scale factor and the negative electrode loading amounts may be included in the negative electrode state data as a diagnostic factor. As another example, when the comparison profile U shown in FIG. 20 is determined as the second profile, at least one of the negative electrode point (ni") of the adjusted negative electrode profile (Rn[j]"), the negative electrode point (nf"), the negative electrode scale factor and the negative electrode loading amount may be included in the negative electrode state data as a diagnostic factor.

For reference, when the target cell BC is in a new product state, as the above profile adjustment logic is executed, the value of at least one of the positive electrode participation start point, the positive electrode participation end point, the negative electrode participation start point, the negative electrode participation end point, the positive electrode scale factor, and the negative electrode scale factors in the BOL state may already be recorded in the memory unit 330.

Figure 21:
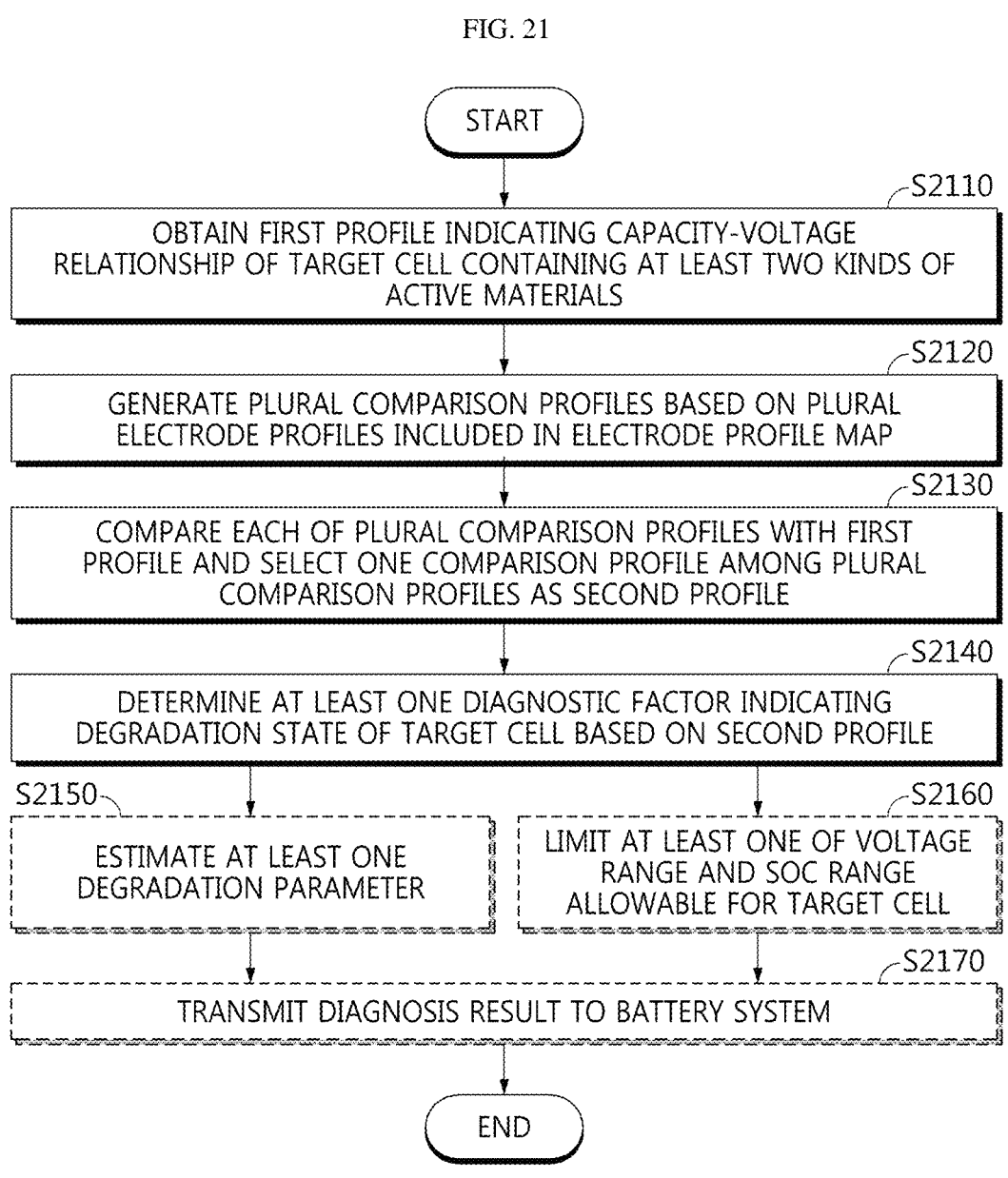
FIG. 21 is a flowchart referenced to schematically describe a battery diagnosis method according to another embodiment of the present disclosure.

FIG. 21 is a flowchart referenced to schematically describe a battery diagnosis method according to another embodiment of the present disclosure. The battery diagnosis method of FIG. 21 may be executed by the battery diagnos-ing apparatus 302.

Referring to FIG. 21, in step S2110, the processor 320 obtains a first profile (see reference sign M in FIG. 14) indicating the capacity-voltage relationship of the target cell BC containing at least two kinds of active materials through the data obtaining unit 310.

As an example, the first profile M may be generated in the battery system 1 and then transmitted to the battery diag-nosing apparatus 302, and the data obtaining unit 310 may receive the first profile M through a communication channel. Alternatively, the data obtaining unit 310 may generate the first profile M by processing capacity-voltage measurement information of the target cell BC collected from the battery system 1.

In step S2120, the processor 320 generates a plurality of comparison profiles based on the plurality of electrode profiles included in the electrode profile map. That is, as described above with reference to FIGS. 1 to 20, the processor 320 generates a plurality of comparison profiles from each of the first to $m×n^{th}$ electrode profile pairs by combination of m reference positive electrode profiles (Rp [1] to Rp[m]) and n reference negative electrode profiles (Rn[1] to Rn[n]). Therefore, the number of comparison profiles generated in step S2120 may be at least twice of m×n.

In step S2130, the processor 320 compares each of the plurality of comparison profiles generated in step S2120 with the first profile and selects one comparison profile among the plurality of comparison profiles as the second profile.

Specifically, the processor 320 generates first to $m×n^{th}$ profile adjustment data from the first to $m×n^{th}$ electrode profile pairs (see FIGS. 15 to 17 and/or FIGS. 18 to 20). Next, the processor 320 may select any one comparison profile having a minimum comparison value among the first to m×n$^{th}$ comparison values indicated by the first to m×n$^{th}$ profile adjustment data as the second profile.

In step S2140, the processor 320 determines at least one diagnostic factor indicating the degradation state of the target cell BC based on the second profile.

Specifically, the processor 320 may determine at least one diagnostic factor indicating the current degradation state of the target cell BC from the profile adjustment data associated with the second profile. As an example, if the comparison profile S shown in FIG. 17 has a minimum comparison value for the first profile M, in step S2140, pi', pf", ni, nf', etc. shown in FIG. 17 may be obtained as the diagnostic factors. As another example, if the comparison profile U shown in FIG. 20 has the minimum comparison value for the first profile M, in step S2140, pi', pf', ni", nf", etc. shown in FIG. 20 may be obtained as the diagnostic factors.

In step S2150, the processor 320 estimates at least one degradation parameter based on at least one diagnostic factor determined in step S2140. For reference, at least one degradation parameter may be included in the profile adjustment data as a diagnostic factor.

In step S2160, the processor 320 limits at least one of the voltage range and the SOC range allowable for the target cell BC based on at least one diagnostic factor determined in step S2140. In conjunction with or instead of this, the current allowable for the target cell BC may be limited (e.g., adjusted downward).

In the memory unit 330, relationship data indicating a predetermined positive or negative correlation between the level of change (e.g., increase amount, decrease amount, increase rate, decrease rate) of at least one diagnostic factor from the BOL state and the limit level may be stored in advance. That is, as the level of change in at least one diagnostic factor increases, at least one of the voltage range and the SOC range allowable for the target cell BC may be gradually reduced. The reduction of a range means at least one of increasing the lower limit and decreasing the upper limit of the range. For example, when the positive electrode capacity (or positive electrode SOC) of the positive electrode participation end point decreases from the value in the BOL state, the upper limit of the voltage range and/or the SOC range allowed for the target cell BC may be limited to a certain level.

In step S2170, the processor 320 may transmit the diagnosis result of the target cell BC to the battery system 1 using the data obtaining unit 310. The diagnosis result includes at least one of the at least one diagnostic factor obtained in step S2140, the at least one degradation parameter estimated in step S2150, and the voltage range and the SOC range limited in step S2160. Visual and/or auditory information indicating the diagnosis result may be output to the user through the battery system 1.

At least one of step S2150, step S2160, and step S2170 may be omitted from the method according to FIG. 21.

In a computer-readable medium according to the present disclosure, instructions for the diagnostic procedures described with reference to FIGS. 1 to 21 may be stored. The instructions in the computer-readable medium, when executed by the processor 320, cause the processor 320 to perform at least one of the diagnostic procedures.

Figure 22:
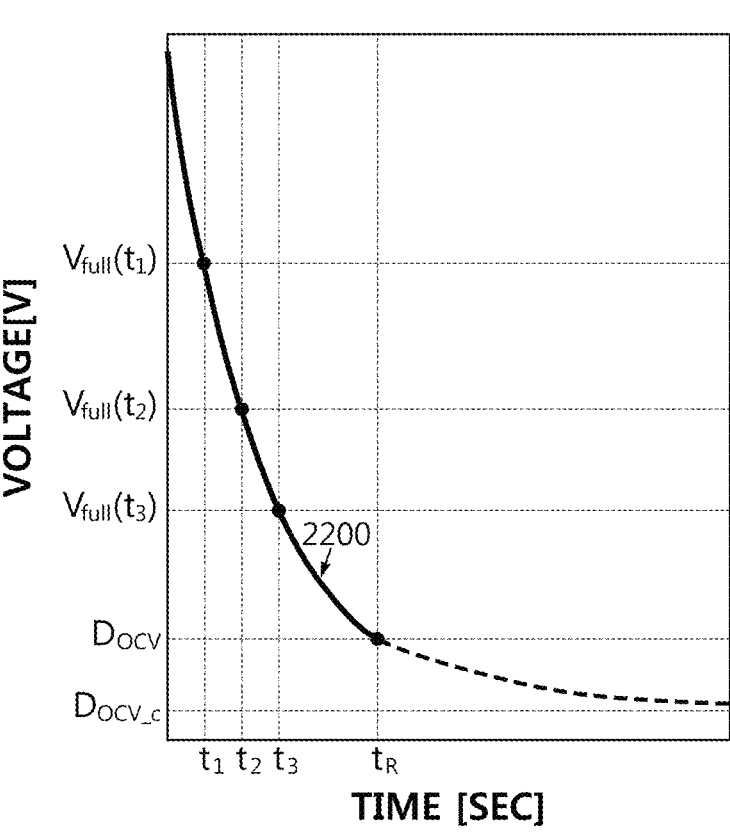
FIG. 22 is a diagram referenced to describe an open-circuit voltage (OCV) estimation procedure that may be performed in the method shown in FIG. 21.

FIG. 22 is a diagram referenced to describe an open-circuit voltage (OCV) estimation procedure that may be performed in the method shown in FIG. 21. Referring to FIG. 13 along with FIG. 22, the processor 320 may estimate OCV for each voltage drop segment based on the voltage measurement information for the state change period.

Reference sign 2200 in FIG. 22 is an enlarged example of one of the voltage drop segments shown in FIG. 13. The voltage measurement information in a specific voltage drop segment corresponding to a specific rest period includes measurement values of a full-cell voltage measured three or more times during the specific rest period. One of the measurement values of the full-cell voltage measured three or more times may be $D_{OCV}$. $t_R$ indicates the time point at which the reference time has elapsed from the start time point of the rest period. The part up to $t_r$ is shown with a solid line, and the part after $t_r$ is shown with a dotted line.

The processor 320 may determine an OCV estimation value of the target cell BC, which is different from the $D_{OCV}$, for each rest period by applying an OCV estimation logic to the measurement values of the full-cell voltage for each rest period. Therefore, if a total of X rest periods are granted during the state change period and the full-cell voltage is measured three times for each rest period, it will be easily understood by those skilled in the art that the voltage measurement information obtained in step S2110 includes 3X full-cell voltage measurement values, and X OCV estimation values may be determined from the 3X full-cell voltage measurement values.

During the rest period, the full-cell voltage of the target cell BC gradually converges toward the OCV corresponding to the SOC of the target cell BC. The behavior of the full-cell voltage of the target cell BC in a specific rest period may be equivalent to the voltage response of a primary RC circuit, such as Formula 1 below.

$$V_{full}(t) = V_{OCV} + (V_S - V_{OCV}) \times e^{-\frac{t}{\tau}} \qquad \langle \text{Formula 1} \rangle$$

In Formula 1, t is an elapsed time from the start time point of a specific rest period, $V_{full}(t)$ is a full-cell voltage at t, $V_{OCV}$ is an actual OCV, $V_s$ is a full-cell voltage at the start time point of a specific rest period, and $\tau$ is a time constant determined by the internal resistance and capacitance of the target cell BC.

In Formula 1, $V_{full}(t)$ is measurable, so $V_{OCV}$, $V_s$, and $\tau$ are unknown. Since there are three unknown values, OCV may be estimated based on $V_{full}(t)$ measured at three different timings in a specific rest period. Formula 2 below may be used to estimate OCV of each rest period.

$$\frac{V_{full}(t_1) - V_{OCV}}{V_{full}(t_2) - V_{OCV}} = \frac{V_{full}(t_2) - V_{OCV}}{V_{full}(t_3) - V_{OCV}} \qquad \langle \text{Formula 2} \rangle$$

In Formula 2, $t_1$, $t_2$ and $t_3$ are sequential measurement timings of the full-cell voltage. The time difference between $t_1$ and $t_2$ may be the same as the time difference between $t_2$ and $t_3$. Meanwhile, in FIGS. 22, $t_R$ and $t_3$ are illustrated as being different, but it is also possible that $t_R=t_3$. In this case, $V_{full}(t_3)=D_{OCV}$.

The processor 320 may determine $D_{OCV\_C}$ in the same way as $V_{OCV}$ calculated through Formula 2.

The processor 320 may determine X number of OCV estimation values by repeating the process of replacing three full-cell voltage measurement values ($V_{full}(t_1)$, $V_{full}(t_2)$, $V_{full}(t_3)$) for each rest period with a single OCV value ($D_{OCV\_C}$) for all rest periods.

For reference, $D_{OCV}$ is the measurement value of the full-cell voltage at the end time point of the rest period (before polarization is completely resolved), while $D_{OCV\_C}$ is the estimation value of the full-cell voltage (i.e., $V_{OCV}$) in a state where polarization is completely resolved. Therefore, it may be regarded that $D_{OCV\_C}$ is closer to the actual OCV of the target cell BC than $D_{OCV}$.

In step S2110, the processor 320 may extract the voltage measurement information from the capacity-voltage measurement information, and then generate corrected voltage measurement information by changing (correcting) $D_{OCV}$ for each rest period indicated by the voltage measurement information to $D_{OCV\_C}$. The processor 320 may generate a measurement full-cell profile M by applying a curve fitting logic to the X OCV estimation values (i.e., $D_{OCV\_C}$) included in the corrected voltage measurement information and the data points based on the capacity measurement information.

From now on, the degradation parameters that may be estimated in step S2150 of FIG. 21 will be described. Table 1 below summarizes degradation parameters and formulas that may be used to determine each degradation parameter.

capacity of the corresponding battery cell may gradually decrease from the value in the BOL state. The total full-cell capacity may represent the capacity difference between both end points of the full-cell profile. For example, the total full-cell capacity may mean a full charge capacity (FCC). The available lithium amount may represent the total amount of lithium that can contribute to charging and discharging of the battery cell. $P_{SOH}$ may represent the maintenance rate of the total positive electrode capacity. $N_{SOH}$ may represent the maintenance rate of the total negative electrode capacity. $L_{SOH}$ may indicate the maintenance rate of the available lithium amount. $F_{SOH}$ may represent the maintenance rate of the total full-cell capacity.

TABLE 1

| Degradation parameter | Formula |
| --- | --- |
| $P_{SOH}$ | $1 - \dfrac{pf_{BOL} - pf_{MOL}}{pf_{BOL} - pi_{BOL}}, \dfrac{pf_{MOL} - pi_{BOL}}{pf_{BOL} - pi_{BOL}}, 1 - \dfrac{pf_{BOL} - pf_{MOL}}{nf_{BOL} - ni_{BOL}}, \dfrac{ps_{MOL}}{ps_{BOL}}$ |
| $N_{SOH}$ | $\dfrac{ns_{MOL}}{ns_{BOL}}$ |
| $L_{SOH}$ | $1 - \dfrac{pi_{MOL} - pi_{BOL}}{pf_{BOL} - pi_{BOL}}, \dfrac{pf_{BOL} - pi_{MOL}}{pf_{BOL} - pi_{BOL}}, 1 - \dfrac{pi_{MOL} - pi_{BOL}}{nf_{BOL} - ni_{BOL}}$ |
| $F_{SOH}$ | $\dfrac{pf_{MOL} - pi_{MOL}}{pf_{BOL} - pi_{BOL}}, \dfrac{nf_{MOL} - ni_{MOL}}{nf_{BOL} - ni_{BOL}}$ |
| $P_{LOSS}$ | $\dfrac{pf_{BOL} - pf_{MOL}}{pf_{BOL} - pi_{BOL}}, \dfrac{pf_{BOL} - pf_{MOL}}{nf_{BOL} - ni_{BOL}}, 1 - \dfrac{ps_{MOL}}{ps_{BOL}}$ |
| $N_{LOSS}$ | $1 - \dfrac{ns_{MOL}}{ns_{BOL}}$ |
| $L_{LOSS}$ | $\dfrac{pi_{MOL} - pi_{BOL}}{pf_{BOL} - pi_{BOL}}, \dfrac{pi_{MOL} - pi_{BOL}}{nf_{BOL} - ni_{BOL}}$ |
| $F_{LOSS}$ | $1 - \dfrac{pf_{MOL} - pi_{MOL}}{pf_{BOL} - pi_{BOL}}, 1 - \dfrac{nf_{MOL} - ni_{MOL}}{nf_{BOL} - ni_{BOL}}, \dfrac{(pf_{BOL} - pi_{BOL}) - (pf_{MOL} - pi_{MOL})}{nf_{BOL} - ni_{BOL}}$ |
| $P_{loading\_MOL}$ | $ps_{MOL} \times P_{loading\_ref}$ |
| $N_{loading\_MOL}$ | $ns_{MOL} \times N_{loading\_ref}$ |

Each of the variables listed in Table 1 is a diagnostic factor that can be obtained in step S2140. The definitions of the degradation parameters and variables in Table 1 may be as follows.

<Degradation Parameters>

$P_{SOH}$: positive electrode SOH (State Of Health) of the target cell BC $N_{SOH}$: negative electrode SOH of the target cell BC $L_{SOH}$: available lithium SOH of the target cell BC $F_{SOH}$: full-cell SOH of the target cell BC $P_{LOSS}$: positive electrode loss rate of the target cell BC $N_{LOSS}$: negative electrode loss rate of the target cell BC $L_{LOSS}$: available lithium loss rate of the target cell BC $F_{LOSS}$: full-cell loss rate of the target cell BC $P_{loading\_MOL}$: positive electrode loading amount of the target cell BC $N_{loading\_MOL}$: negative electrode loading amount of the target cell BC As any battery cell deteriorates, at least one of the total positive electrode capacity, the total negative electrode capacity, the available lithium amount, and the total full-cell The sum of $P_{SOH}$ and $P_{LOSS}$, the sum of $N_{SOH}$ and $N_{LOSS}$, the sum of $L_{SOH}$ and $L_{LOSS}$, and the sum of $F_{SOH}$ and $F_{LOSS}$ may be equal to 1, respectively. $F_{LOSS}$ may be equal to the sum of $P_{LOSS}$ and $L_{LOSS}$.

The positive electrode loading amount of a certain battery cell represents the amount of positive electrode active material per unit area of the positive electrode of the corresponding battery cell. The negative electrode loading amount of a certain battery cell represents the amount of negative electrode active material per unit area of the negative electrode of the corresponding battery cell. The unit of loading amount may be $mAh/cm^2$ or $mg/cm^2$. In Table 1, $P_{loading\_ref}$ represents the reference positive electrode loading amount, and $N_{loading\_ref}$ represents the reference negative electrode loading amount. The reference positive electrode loading amount is predetermined to represent the positive electrode loading amount at the time of release of a normal battery cell. The reference negative electrode loading amount is predetermined to represent the negative electrode loading amount at the time of release of a normal battery cell.

<Variables>

$pi_{BOL}$: positive electrode capacity (positive electrode SOC) of the positive electrode participation start point when the target cell BC is in the BOL state $pi_{MOL}$: positive electrode capacity (positive electrode SOC) of the current positive electrode participation start point (e.g., pi' shown in FIG. 17) of the target cell BC $pf_{BOL}$: positive electrode capacity (positive electrode SOC) of the positive electrode participation end point when the target cell BC is in the BOL state $pf_{MOL}$: positive electrode capacity (positive electrode SOC) of the current positive electrode participation end point (e.g., pf'' shown in FIG. 17) of the target cell BC $ni_{BOL}$: negative electrode capacity (negative electrode SOC) at the negative electrode participation start point when the target cell BC is in the BOL state $ni_{MOL}$: negative electrode capacity (negative electrode SOC) of the current negative electrode participation start point (e.g., ni shown in FIG. 17) of the target cell BC $nf_{BOL}$: negative electrode capacity (negative electrode SOC) of the negative electrode participation end point when the target cell BC is in the BOL state $nf_{MOL}$: negative electrode capacity (negative electrode SOC) of the current negative electrode participation end point (e.g., nf' shown in FIG. 17) of the target cell BC $ps_{BOL}$: positive electrode scale factor when the target cell BC is in the BOL state $ps_{MOL}$: current positive electrode scale factor of the target cell BC $ns_{BOL}$: negative electrode scale factor when the target cell BC is in the BOL state $ns_{MOL}$: current negative electrode scale factor of the target cell BC The process of determining a diagnostic factor using the profile adjustment logic described above may be repeated periodically or aperiodically throughout the entire life of the target cell BC. Therefore, when the target cell BC is in the MOL state, at least one of the diagnostic factors ($pi_{BOL}$, $pf_{BOL}$, $ni_{BOL}$, $nf_{BOL}$, $PS_{BOL}$, $NS_{BOL}$) and the degradation parameters ($P_{SOH}$, $N_{SOH}$, $L_{SOH}$, $F_{SOH}$, $P_{LOSS}$, $N_{LOSS}$, $L_{LOSS}$, $F_{LOSS}$, $P_{loading}$, $N_{loading}$) when in the BOL state may already be recorded in the memory unit 330 or the like. For example, the diagnostic factors ($pi_{BOL}$, $pf_{BOL}$, $ni_{BOL}$, $nf_{BOL}$, $PS_{BOL}$, $NS_{BOL}$) may be values at the time of release of the target cell BC. In addition, the processor 320 may record the change history of at least one of the diagnostic factors ($pi_{MOL}$, $pf_{MOL}$, $ni_{MOL}$, $nf_{MOL}$, $PS_{MOL}$, $ns_{MOL}$) and/or at least one of the degradation parameters ($P_{SOH}$, $N_{SOH}$, $L_{SOH}$, $F_{SOH}$, $P_{LOSS}$, $N_{LOSS}$, $L_{LOSS}$, $F_{LOSS}$, $P_{loading\_MOL}$, $N_{loading\_MOL}$) in the memory unit 330 during the entire life of the target cell BC.

$P_{loading\_MOL}$, which is proportional to $ps_{MOL}$, may be included in the profile adjustment data associated with the second profile as a diagnostic factor rather than as a degradation parameter. Likewise, $N_{loading\_MOL}$, which is proportional to $ns_{MOL}$, may be included in the profile adjustment data associated with the second profile as a diagnostic factor rather than as a degradation parameter.

Hereinafter, assuming that the positive electrode of the target cell BC contains manganese-rich, the relationship between diagnostic factors ($pi_{BOL}$, $pf_{BOL}$, $ni_{BOL}$, $nf_{BOL}$, $PS_{BOL}$, $NS_{BOL}$) and degradation parameters ($P_{SOH}$, $N_{SOH}$, $L_{SOH}$, $F_{SOH}$, $P_{LOSS}$, $N_{LOSS}$, $L_{LOSS}$, $F_{LOSS}$, $P_{loading}$, $N_{loading}$) according to degradation will be explained in detail.

As $P_{LOSS}$ increases, redox reaction of oxygen (oxygen-redox) increases and $pf_{MOL}$ may decrease from $pf_{BOL}$. The decrease in $pf_{MOL}$ may promote the increase in the positive electrode voltage at the positive electrode participation end point, thereby further increasing the oxygen-redox reaction. Accordingly, the processor 320 may diagnose that $P_{LOSS}$ of the target cell BC is increasing based on the decrease in $pf_{MOL}$ identified by the method of FIG. 21. In addition, the processor 320 may suppress the increase in the positive electrode voltage at the positive electrode participation end point by reducing the upper limit of the voltage range allowed for the target cell BC in response to the decrease in $pf_{MOL}$, which may make the oxygen-redox reaction slower.

In the early part of the BOL state, the redox reaction of manganese (Mn-redox) increases, so the amount of available lithium may increase compared to that of the release time, and each of the positive electrode capacity (or positive electrode SOC) at the positive electrode participation start point and the negative electrode capacity (or negative electrode SOC) at the negative electrode participation start point may be reduced compared to that of the release time. The increase in available lithium amount may lead to an increase in total full-cell capacity. After the early part of the BOL state, the amount of available lithium stops increasing. After that, each of the positive electrode capacity (or positive electrode SOC) at the positive electrode participation start point and the negative electrode capacity (or negative electrode SOC) at the negative electrode participation start point gradually increases, which is an indicator of degradation representing that the amount of available lithium is decreasing. Accordingly, the processor 320 may diagnose that at least one of $L_{LOSS}$ and $N_{LOSS}$ of the target cell BC is increasing based on the increase in $pi_{MOL}$ and/or the increase in identified by the method of FIG. 21. Also, the processor 320 may reduce the upper limit of the voltage range allowed for the target cell BC in response to the increase in $pi_{MOL}$ and/or the increase in $ni_{MOL}$.

The redox reaction of oxygen (oxygen-redox) and the redox reaction of manganese (Mn-redox) tend to increase together, and as a result, the gap between $pi_{MOL}$ and $pf_{MOL}$ narrows, and as $P_{LOSS}$ increases, $ps_{MOL}$ and/or $P_{loading\_MOL}$ may decrease. The processor 320 may diagnose that $P_{LOSS}$ of the target cell BC is increasing based on the decrease in psMOL and/or $P_{loading\_MOL}$ identified by the method of FIG. 21. Also, the processor 320 may reduce the upper limit of the voltage range and/or the SOC range allowed for the target cell BC in response to the decrease in $ps_{MOL}$ and/or $P_{loading\_MOL}$.

When the negative electrode is exposed to the low-potential region by charging and discharging the target cell BC, the crystal structure of the negative electrode changes, and products of side reactions (e.g., SEI, Solid Electrolyte Interphase) accumulate on the surface of the negative electrode, resulting in the decrease in negative electrode reactivity. In other words, $N_{LOSS}$ decreases, and $nf_{MOL}$ decreases accordingly. The increase in $ni_{MOL}$ and the decrease in $nf_{MOL}$ mean the decrease in $ns_{MOL}$ and/or $N_{loading\_MOL}$. The processor 320 may diagnose that $N_{LOSS}$ of the target cell BC is increasing based on the decrease in $nf_{MOL}$, $ns_{MOL}$, and/or $N_{loading\_MOL}$ identified by the method of FIG. 21. Also, the processor 320 may reduce the upper limit of the voltage range and/or the SOC range allowed for the target cell BC in response to the decrease in $nf_{MOL}$, $ns_{MOL}$, and/or $N_{loading\_MOL}$.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

REFERENCE SIGNS

1: battery system
10: battery pack
BC: battery cell
300: charging station
301: stimulation applying device
302: battery diagnosing apparatus
310: data obtaining unit
320: processor
330: memory unit

What is claimed is:

1. A battery diagnosing apparatus, comprising:
a processor configured to obtain a first profile representing a capacity-voltage relationship of a battery cell, the battery cell comprising at least two kinds of active materials; and
the processor configured to generate a plurality of comparison profiles based on a plurality of electrode profiles included in an electrode profile map,
wherein the processor is configured to:
select, as a second profile, one comparison profile from the plurality of comparison profiles by comparing each of the plurality of comparison profiles with the first profile; and
determine at least one diagnostic factor representing a degradation state of the battery cell based on the second profile,
wherein the electrode profile map includes a plurality of reference positive electrode profiles associated with a plurality of degradation states of a positive electrode of the battery cell, and
wherein the at least two kinds of active materials are included in the positive electrode of the battery cell.

2. The battery diagnosing apparatus according to claim 1, wherein each of at least two reference positive electrode profiles of the plurality of reference positive electrode profiles is a degradation positive electrode profile representing a capacity-voltage relationship of a positive electrode half-cell.

3. The battery diagnosing apparatus according to claim 2, wherein the processor is configured to determine a comparison value based on the at least two reference positive electrode profiles, and
wherein the comparison value is greater than a threshold value.

4. The battery diagnosing apparatus according to claim 1, wherein the electrode profile map includes a plurality of reference negative electrode profiles associated with a plurality of degradation states of a negative electrode of the battery cell, and
wherein the at least two kinds of active materials are included in the negative electrode of the battery cell.

5. The battery diagnosing apparatus according to claim 4, wherein each of at least two reference negative electrode profiles of the plurality of reference negative electrode profiles is a degradation negative electrode profile representing a capacity-voltage relationship of a negative electrode half-cell.

6. The battery diagnosing apparatus according to claim 5, wherein a comparison value between the at least two reference negative electrode profiles is greater than a threshold value.

7. The battery diagnosing apparatus according to claim 1, wherein the processor is configured to generate the plurality of comparison profiles by performing an adjustment procedure for each of the plurality of electrode profiles according to a plurality of adjustment levels.

8. The battery diagnosing apparatus according to claim 7, wherein the adjustment procedure comprises at least one of a scaling operation or a shifting operation based on capacity relationship values of the battery cell.

9. The battery diagnosing apparatus according to claim 7, wherein the processor is configured to determine a plurality of comparison values by comparing each of the plurality of comparison profiles with the first profile, and
wherein the second profile is associated with a minimum comparison value among the plurality of comparison values.

10. The battery diagnosing apparatus according to claim 9, wherein the processor is configured to generate profile adjustment data associated with the second profile,
wherein the profile adjustment data includes at least one of positive electrode state data associated with an adjusted positive electrode profile and negative electrode state data associated with an adjusted negative electrode profile,
wherein the adjusted positive electrode profile and the adjusted negative electrode profile are generated by adjusting two electrode profiles of the plurality of electrode profiles, and
wherein the adjusted positive electrode profile and the adjusted negative electrode profile are used to generate the second profile.

11. The battery diagnosing apparatus according to claim 10, wherein the processor is configured to generate the second profile based on voltage difference data representing voltage difference between the adjusted positive electrode profile and the adjusted negative electrode profile.

12. The battery diagnosing apparatus according to claim 10, wherein the positive electrode state data includes at least one of a first positive electrode point, a second positive electrode point, a positive electrode scale factor, and a positive electrode loading amount as the at least one diagnostic factor.

13. The battery diagnosing apparatus according to claim 10, wherein the negative electrode state data includes at least one of a first negative electrode point, a second negative electrode point, a negative electrode scale factor, and a negative electrode loading amount as the at least one diagnostic factor.

14. The battery diagnosing apparatus according to claim 1, wherein the processor is configured to limit at least one of a voltage range and a State of Charge (SOC) range for the battery cell, based on the at least one diagnostic factor.

15. A battery pack, comprising the battery diagnosing apparatus according to claim 1.

16. A battery system, comprising the battery diagnosing apparatus according to claim 1.

17. A remote diagnosing server, comprising the battery diagnosing apparatus according to claim 1.

18. A battery diagnosing method, comprising:

obtaining a first profile representing a capacity-voltage relationship of a battery cell, the battery cell comprising at least two kinds of active materials;

generating a plurality of comparison profile based on a plurality of electrode profiles included in an electrode profile map;

selecting, as a second profile, one comparison profile from the plurality of comparison profiles by comparing each of the plurality of comparison profiles with the first profile; and determining at least one diagnostic factor representing a degradation state of the battery cell based on the second profile, wherein the electrode profile map includes a plurality of reference positive electrode profiles associated with a plurality of degradation states of a positive electrode of the battery cell, and wherein the at least two kinds of active materials are included in the positive electrode of the battery cell.

19. A non-transitory computer-readable medium storing instructions for diagnosing a battery cell, the instructions, when executed by one or more processors, causing the one or more processors to perform operations comprising:

obtaining a first profile representing a capacity-voltage relationship of the battery cell, the battery cell comprising at least two kinds of active materials;

generating a plurality of comparison profile based on a plurality of electrode profiles included in an electrode profile map;

selecting, as a second profile, one comparison profile from the plurality of comparison profiles by comparing each of the plurality of comparison profiles with the first profile; and determining at least one diagnostic factor representing a degradation state of the battery cell based on the second profile, wherein the electrode profile map includes a plurality of reference positive electrode profiles associated with a plurality of degradation states of a positive electrode of the battery cell, and wherein the at least two kinds of active materials are included in the positive electrode of the battery cell.

* * * * *